(12) United States Patent
Senda et al.

(10) Patent No.: US 7,268,612 B2
(45) Date of Patent: Sep. 11, 2007

(54) SEMICONDUCTOR DEVICE WITH PUMP CIRCUIT

(75) Inventors: Minoru Senda, Hyogo (JP); Kiyohiro Furutani, Hyogo (JP); Taku Ogura, Hyogo (JP); Shigehiro Kuge, Hyogo (JP); Satoshi Kawasaki, Hyogo (JP); Tadaaki Yamauchi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/699,427

(22) Filed: Jan. 30, 2007

(65) Prior Publication Data

US 2007/0120592 A1    May 31, 2007

Related U.S. Application Data

(62) Division of application No. 10/941,004, filed on Sep. 15, 2004, now Pat. No. 7,180,362.

(30) Foreign Application Priority Data

Sep. 16, 2003    (JP) .............................. 2003-323412

(51) Int. Cl.
*G05F 1/10*    (2006.01)
(52) U.S. Cl. ...................... 327/536; 327/537
(58) Field of Classification Search .................... None
See application file for complete search history.

(56) References Cited

U.S. PATENT DOCUMENTS

| 5,337,284 | A | * | 8/1994 | Cordoba et al. ............ 365/227 |
| 5,889,428 | A | | 3/1999 | Young |
| 5,909,141 | A | * | 6/1999 | Tomishima ................. 327/536 |
| 5,982,223 | A | | 11/1999 | Park et al. |
| 6,255,896 | B1 | | 7/2001 | Li et al. |
| 6,278,315 | B1 | | 8/2001 | Kim |
| 6,337,595 | B1 | | 1/2002 | Hsu et al. |
| 6,486,729 | B2 | | 11/2002 | Imamiya |
| 6,507,237 | B2 | * | 1/2003 | Hsu et al. ................... 327/538 |
| 6,515,535 | B2 | | 2/2003 | Myono |
| 6,781,440 | B2 | | 8/2004 | Huang |
| 6,912,159 | B2 | * | 6/2005 | Osawa et al. .......... 365/185.18 |
| 7,005,912 | B2 | | 2/2006 | Nonaka |
| 7,116,156 | B2 | | 10/2006 | Myono et al. |
| 2004/0246044 | A1 | | 12/2004 | Myono et al. |
| 2005/0110560 | A1 | | 5/2005 | Kim et al. |

FOREIGN PATENT DOCUMENTS

| JP | 6-283667 | 10/1994 |
| JP | 7-111093 | 4/1995 |
| JP | 2002-032987 | 1/2002 |

* cited by examiner

*Primary Examiner*—Kenneth B. Wells
*Assistant Examiner*—An T. Luu
(74) *Attorney, Agent, or Firm*—McDermott Will & Emery LLP

(57) ABSTRACT

In the present semiconductor device a positive, driving pump circuit is driven by an external power supply potential EXVDD (for example of 1.8V) to generate a positive voltage VPC (for example of 2.4V). A negative pump circuit for internal operation is driven by the positive voltage VPC to generate a negative voltage VNA (for example of −9.2V) required in an erasure or similar internal operation for a word line. The negative pump circuit for internal operation can have a smaller number of stages of pump and hence consume a smaller area than when the circuit is driven by the external power supply voltage EXVDD (for example of 1.8V) as conventional.

2 Claims, 20 Drawing Sheets

TIME t

SEMICONDUCTOR DEVICE WITH PUMP CIRCUIT

The present application is a Divisional of U.S. application Ser. No. 10/941,004, filed on Sep. 15, 2004, now U.S. Pat. No. 7,180,362, which claims priority from Japanese Application No. JP 2003-323412.

BACKGROUND OF THE INVENTION

1. Field of the Invention

The present invention relates generally to semiconductor devices and particularly to semiconductor devices including a charge pump circuit and a clock driver.

2. Description of the Background Art

In flash memory, a non-volatile memory capable of electrical erasure and rewriting, word and bit lines are set to different potential depending on each mode of operation. For example, a word line in a read is set to 5.5V and in a programming operation is set to 9.7V, and in data erasure is set to −9.2V. A bit line in a read is set to 0.7V and in a programming operation is set to 5.1V. Furthermore, a well potential in a read is set to 0V and in a programming operation is set to −0.9V. Accordingly to generate from a single external power supply voltage (for example of 1.8V) a voltage required in each mode of operation a variety of pump circuits are provided.

A proposed, conventional pump circuit generating a negative voltage resets a constituent P channel MOS transistor's gate electrode in potential when the pump circuit is inactive. The second and succeeding pump operations can also be performed without reduced rates of generating the negative voltage (see Japanese Patent Laying-Open No. 2002-032987 for example).

Furthermore, there is also another conventional pump circuit proposed to share a pump module operating in standby and active cycles. This can eliminate the necessity of separate circuits for the standby and active cycles, respectively, and a reduced circuit area can be achieved (see Japanese Patent Laying-Open No. 07-111093 for example).

In recent years there is a demand for a semiconductor device having a further reduced area. Conventional semiconductor devices, however, have not yet achieved a sufficiently reduced pump circuit area.

SUMMARY OF THE INVENTION

Accordingly the present invention mainly contemplates a semiconductor device having a small area.

The present invention provides a semiconductor device including: a first charge pump circuit driven by a first type of clock signal corresponding to a first amplitude voltage to generate a prescribed potential; an amplitude conversion circuit converting the first amplitude voltage of the first type of clock signal to a second amplitude voltage to output a second type of clock signal, the second amplitude voltage being larger than the first amplitude voltage and corresponding to the prescribed potential; and a second charge pump circuit driven by the second type of clock signal. The second charge pump can have a reduced number of pump stages and the semiconductor device can be reduced in area.

The present invention in another aspect provides a semiconductor device including: a first charge pump circuit pumping in an active time when the semiconductor device has an internal circuit in operation; a second charge pump circuit having an output node connected to the first charge pump circuit's output node and pumping in a standby time when the semiconductor device has the internal circuit on standby; and a third charge pump circuit having an input node connected to the first and second charge pump circuits' output node and pumping in the active and standby times. As the third charge pump circuit can be shared in the active and standby times, the semiconductor device can be reduced in area.

The present invention in still another aspect provides a semiconductor device including a clock driver and provided with: a first clock driver circuit having a first inverter with a first transistor of a first conductance and a second transistor of a second conductance connected in series between a power supply potential node and a reference potential node to transmit the clock signal when a power supply potential is associated with a specification of a first level; and a second clock driver circuit having a second inverter with a third transistor of the first conductance and a fourth transistor of the second conductance having a gate insulation film smaller in thickness than that of the first and second transistors and connected in series between the power supply potential node and the reference potential node to transmit the clock signal when a power supply potential is associated with a specification of a second level lower than the first level. When the power supply potential is the first level the third and fourth transistors each have gate and drain electrodes connected to a source electrode and when the power supply potential is the second level the third and fourth transistors have their gate electrodes connected in common to an input node of the second inverter and the third and fourth transistors have their drain electrodes connected in common to an output node of the second inverter. As the first and third transistors can be provided within a single well region the semiconductor device can be reduced in area.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
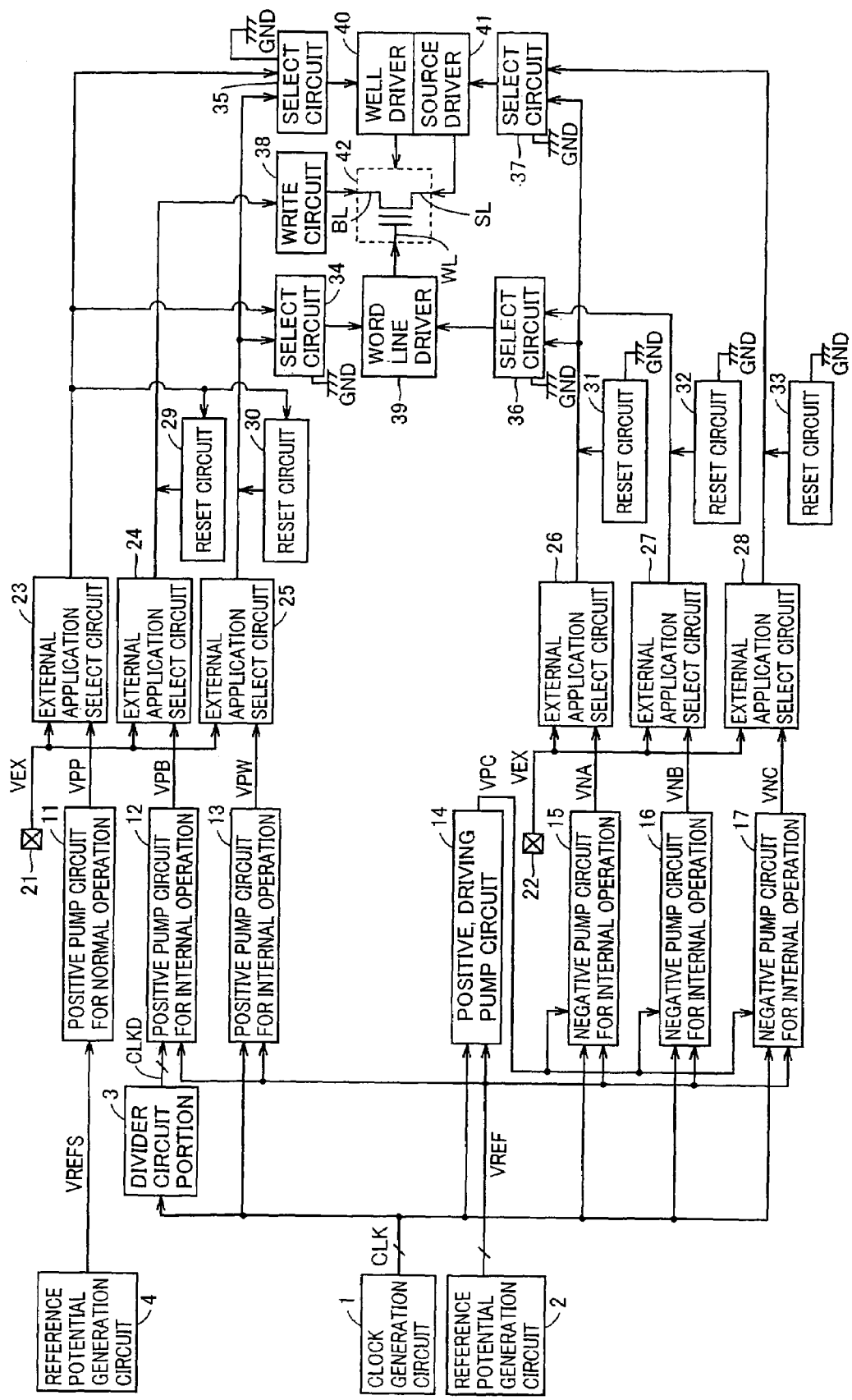
FIG. 1 is a block diagram schematically showing a configuration of a semiconductor integrated circuit device in accordance with one embodiment of the present invention.

With reference to FIG. 1, a semiconductor integrated circuit device includes a clock generation circuit 1, reference potential generation circuits 2, 4, a divider circuit portion 3, a positive pump circuit for normal operation 11, positive pump circuits for internal operation 12, 13, a positive, driving pump circuit 14, negative pump circuits for internal operation 15-17, input terminals 21, 22, external application select circuits 23-28, reset circuits 29-33, select circuits 34-37, a write circuit 38, a word line driver 39, a well driver 40, a source driver 41 and a memory portion 42.

The positive pump circuit for normal operation 11, the positive pump circuits for internal operation 12, 13, and positive, driving pump circuit 14 are driven by a single, external power supply potential EXVDD (for example of 1.8V). The negative pump circuits for internal operation 15-17 are driven by a potential VPC (for example of 2.4V) provided from positive, driving pump circuit 14.

Clock generation circuit 1 generates a clock signal CLK required for each pump circuit. Reference potential generation circuit 2 generates a reference potential VREF required for each pump circuit. Divider circuit portion 3 divides clock signal CLK output from clock generation circuit 1 to output a clock signal CLKD. Reference potential generation circuit 4 generates a reference potential VREFS required for the positive pump circuit for normal operation 11.

The positive pump circuit for normal operation 11 receives reference potential VREFS to generate a positive potential VPP (for example of 5.5V) required for example in a read or similar, normal operation for a word line. The positive pump circuit for internal operation 12 receives clock signal CLKD and reference potential VREF to generate a positive potential VPB (for example of 5.1V) required for example in a programming or similar internal operation for a bit line. The positive pump circuit for internal operation 13 receives clock signal CLK and reference potential VREF to generate a positive potential VPW (for example of 9.7V) required for example in a programming or similar internal operation for a word line.

Positive, driving pump circuit 14 receives clock signal CLK and reference potential VREF to generate and provide positive potential VPC (for example of 2.4V) to the negative pump circuits for internal operation 15-17. The negative pump circuit for internal operation 15 receives clock signal CLK and reference potential VREF to generate a negative potential VNA (for example of −9.2V) required for example in an erasure or similar internal operation for a word line. The negative pump circuit for internal operation 16 receives clock signal CLK and reference potential VREF to generate a negative potential VNB (for example of −0.5V) required for example in a programming or similar internal operation for word line driver 39. The negative pump circuit for internal operation 17 receives clock signal CLK and reference potential VREF to generate a negative potential VNC (for example of −0.9V) required for example in a programming or similar internal operation for the well.

Input terminals 21 and 22 receive an external potential VEX. External application select circuit 23 selects and outputs one of external potential VEX received from input terminal 21 and potential VPP received from the positive pump circuit for normal operation 11. External application select circuit 24 selects and outputs one of external potential VEX received from input terminal 21 and potential VPB received from the positive pump circuit for internal operation 12. External application select circuit 25 selects and outputs one of external potential VEX received from input terminal 21 and potential VPW received from the positive pump circuit for internal operation 13. External application select circuit 26 selects and outputs one of external potential VEX received from input terminal 22 and potential VNA received from the negative pump circuit for internal operation 15. External application select circuit 27 selects and outputs one of external potential VEX received from input terminal 22 and potential VNB received from the negative pump circuit for internal operation 16. External application select circuit 28 selects and outputs one of external potential VEX received from input terminal 22 and potential VNC received from the negative pump circuit for internal operation 17.

Reset circuit 29 performs a reset operation providing a potential output from external application select circuit 23 to an output node of external application select circuit 24 when the positive pump circuit for internal operation 12 is inactive. Reset circuit 30 performs a reset operation providing a potential output from external application select circuit 23 to an output node of external application select circuit 25 when the positive pump circuit for internal operation 13 is inactive. Reset circuit 31 performs a reset operation resetting an output node of external application select circuit 26 to a ground potential (0V) when the negative pump circuit for internal operation 15 is inactive. Reset circuit 32 performs a reset operation resetting an output node of external application select circuit 27 to a ground potential (0V) when the negative pump circuit for internal operation 16 is inactive. Reset circuit 33 performs a reset operation resetting an output node of external application select circuit 28 to a ground potential (0V) when the negative pump circuit for internal operation 17 is inactive.

Select circuit 34 selects one of potentials output from external application select circuits 23 and 25 and the ground potential (0V) and provides the selected potential to word driver 39. Select circuit 35 selects one of the potentials output from external application select circuits 23 and 25 and the ground potential (0V) and provides the selected potential to well driver 40 and source driver 41. Select circuit 36 selects one of potentials output from external application select circuits 26 and 27 and the ground potential (0V) to provide the selected potential to word driver 39. Select circuit 37 selects one of potentials output from external application select circuits 26 and 28 and the ground potential (0V) to provide the selected potential to well and source drivers 40 and 41.

Write circuit 38 receives a potential output from external application select circuit 24 and provides to bit line BL of memory portion 42 a prescribed potential corresponding to a mode of operation. Word line driver 39 receives potentials output from select circuits 34 and 36 and provides to word line WL of memory portion 42 a prescribed potential corresponding to a mode of operation. Well driver 40 receives potentials output from select circuits 35 and 37 and provides to a well of memory portion 42 a prescribed potential corresponding to a mode of operation. Source driver 41 receives potentials output from select circuits 35 and 37 and provides to source line SL of memory portion 42 a prescribed potential corresponding to a mode of operation. Memory portion 42 includes a plurality of memory cells to store data.

For example in a read operation the positive pump circuit for normal operation 11 provides potential VPP (for example of 5.5V) which is in turn provided via external application select circuit 23, select circuit 34 and word line driver 39 to memory portion 42 on word line WL. The memory portion 42 well receives the ground potential (0V) from select circuit 37 via well driver 40. Furthermore, the memory portion 42 source line SL receives the ground potential (0V) from select circuit 37 via source driver 41.

In a programming operation the positive pump circuit for internal operation 13 provides potential VPW (for example of 9.7V) which is in turn provided via external application select circuit 25, select circuit 34 and word line driver 39 to memory portion 42 on word line WL. Furthermore, the positive pump circuit for internal operation 12 provides potential VPB (for example of 5.1V) which is in turn provided via external application select circuit 24 and write circuit 38 to memory portion 42 on bit line BL. Furthermore, the negative pump circuit for internal operation 17 provides potential VNC (for example of −0.9V) which is in turn provided via external application select circuit 28, select circuit 37 and well driver 40 to memory portion 42 at the well. Furthermore, the memory portion 42 source line SL receives the ground potential (0V) from select circuit 35.

In an erasure operation the negative pump circuit for internal operation 15 provides potential VNA (for example of −9.2V) which is in turn provided via external application select circuit 26, select circuit 36 and word line driver 39 to memory portion 42 on word line WL. The memory portion 42 well receives potential VPW (for example of 7.5V) from the positive pump circuit for internal operation 13 via external application select circuit 25, select circuit 35 and well driver 40. Furthermore, the memory portion 42 source line SL receives potential VPW (for example of 7.5V) from the positive pump circuit for internal operation 13 via external application select circuit 25, select circuit 35 and source driver 41. Note that the positive pump circuit for internal operation 13 outputs potential VPW, which has a level switched in accordance with a state of operation (for example in a programming operation it is set to 9.7V and in an erasure operation it is set to 7.5V).

Figure 2:
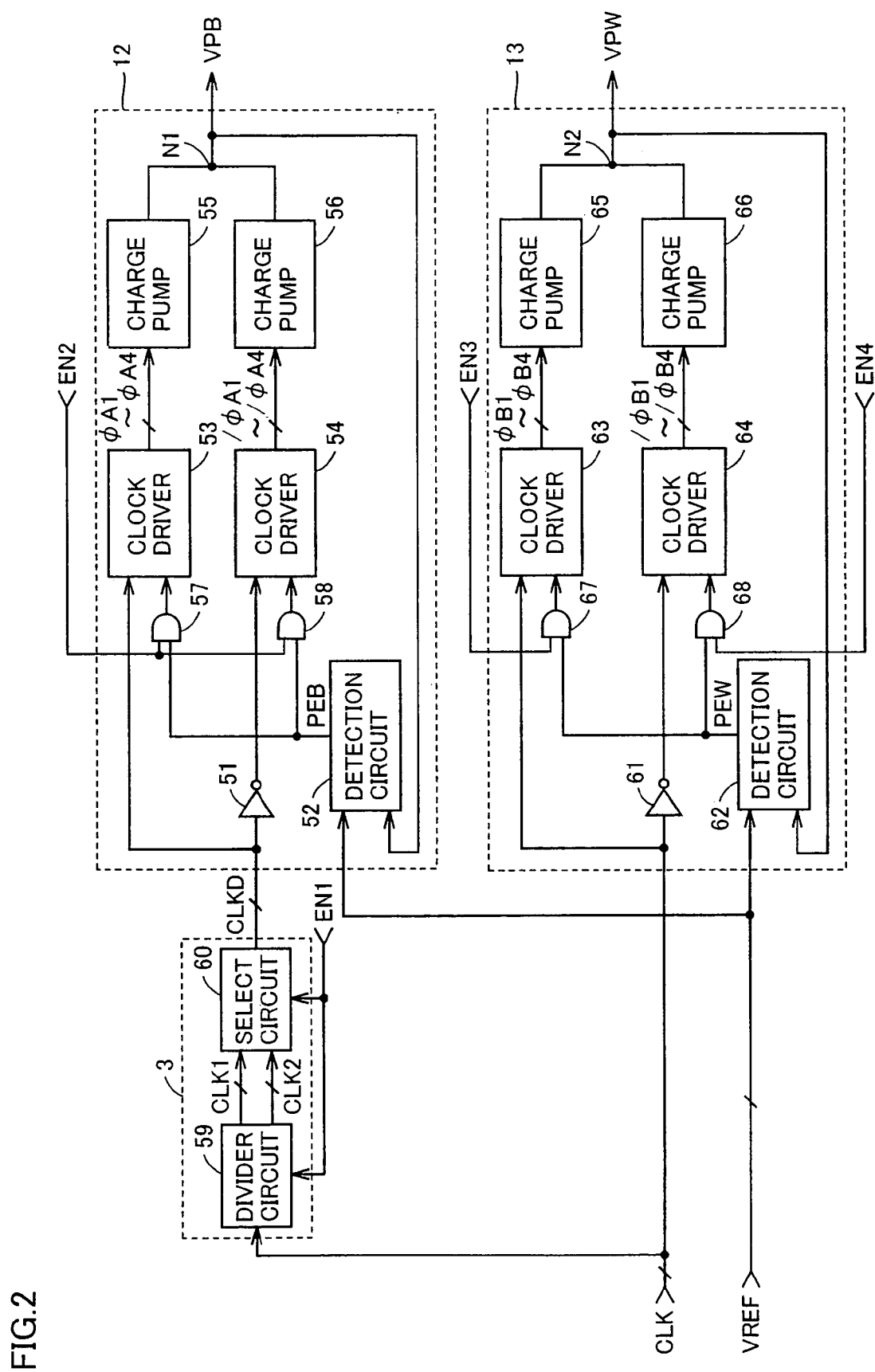
FIG. 2 is a block diagram showing a configuration of a divider circuit and positive pump circuits for internal operation 12, 13 as shown in FIG. 1.

With reference to FIG. 2, divider circuit portion 3 includes a divider circuit 59 and a select circuit 60. The positive pump circuit for internal operation 12 includes an inverter 51, a detection circuit 52, clock drivers 53 and 54, charge pumps 55 and 56, and AND circuits 57 and 58. The positive pump circuit for internal operation 13 includes an inverter 61, a detection circuit 62, clock drivers 63 and 64, charge pumps 65 and 66, and AND circuits 67 and 68.

Divider circuit 59 for an enable signal EN1 having the high level of an activation level divides (or reduces in frequency) clock signal CLK received from clock generation circuit 1 to generate a clock signal CLK1. For enable signal EN1 having the low level of an inactivation level, divider circuit 59 exactly outputs clock signal CLK as a clock signal CLK2. Select circuit 60 for enable signal EN1 having the high level of the activation level selects clock signal CLK1 received from divider circuit 59 and outputs the signal as clock signal CLKD. For enable signal EN1 having the low level of the inactivation level, select circuit 60 selects clock signal CLK2 output from divider circuit 59 and outputs the signal as clock signal CLKD. Inverter 51 inverts clock signal CLKD in logic level for output. Inverter 61 inverts clock signal CLK in logic level for output.

Figure 3:
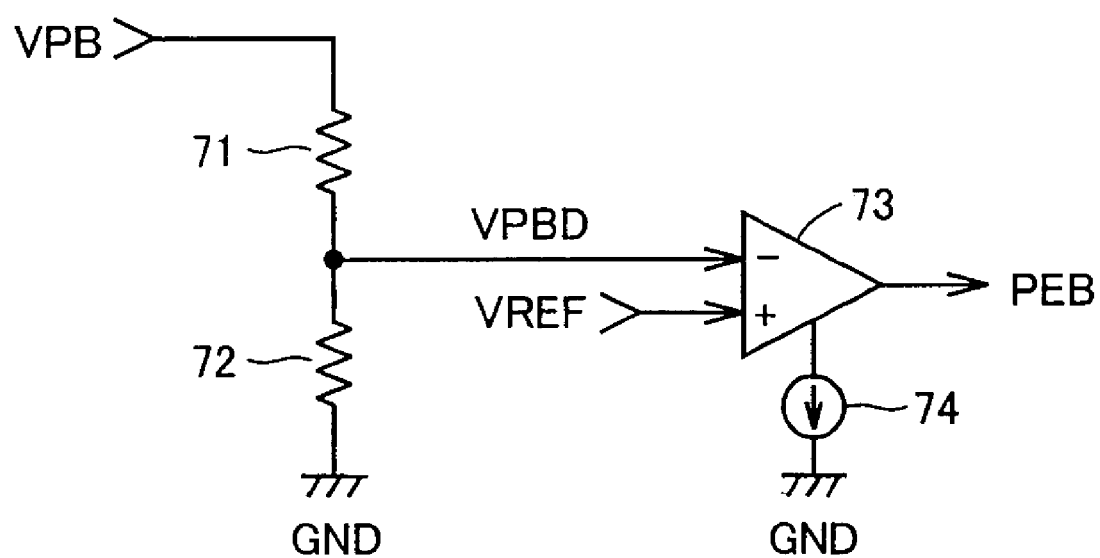
FIG. 3 is a circuit diagram showing a configuration of a detection circuit 52 shown in FIG. 2.

With reference to FIG. 3, detection circuit 52 includes resistors 71 and 72, a comparison circuit 73, and a constant current source 74. Potential VBP, provided from output node N1, is divided by resistors 71 and 72 in voltage and provided as a divided voltage potential VPBD to a negative input terminal of comparison circuit 73. Comparison circuit 73 has a positive input terminal receiving reference potential VREF, a potential corresponding to a target level of potential VPB. Constant current source 74 is connected between a ground terminal of comparison circuit 83 and a line of a ground potential GND.

Comparison circuit 73 compares divided voltage potential VPBD with reference potential VREF and if divided potential VPBD is lower than reference potential VREF comparison circuit 73 outputs a detection signal PEB set high and if divided voltage potential VPBD is higher than reference potential VREF comparison circuit 73 outputs detection signal PEB set low. Thus detection circuit 52 operates in accordance with reference potential VREF provided from reference potential generation circuit 2 and potential VPB provided from output node N1 to output detection signal PEB to AND circuits 57 and 58.

Again with reference to FIG. 2 detection circuit 62 is similar in configuration and operation to the FIG. 3 detection circuit 52, operating in accordance with reference potential VREF provided from reference potential generation circuit 2 and potential VPW provided from output node N2 to output a detection signal PEW to AND circuits 67 and 68.

AND circuits 57 and 58 receive an enable signal EN2 externally and detection signal PEB from detection circuit 52. AND circuit 57 outputs a signal provided to clock driver 53. AND circuit 58 outputs a signal provided to clock driver 54. AND circuit 67 receives an enable signal EN3 externally and detection signal PEW from detection circuit 62. AND circuit 67 outputs a signal provided to clock driver 63. AND circuit 68 receives an enable signal EN4 externally and detection signal PEW from detection circuit 62. AND circuit 68 outputs a signal provided to clock driver 64.

Clock driver 53 is activated in response a signal of the high level output from AND circuit 57 to amplify clock signal CLKD received from divider circuit portion 3 in current to generate a 4-phase clock signal φA1-φA4 and provides the signal to charge pump 55. When AND circuit 57 outputs a signal of the low level clock driver 53 is inactivated and does not transmit clock signal CLKD received from divider circuit portion 3.

Figure 4:
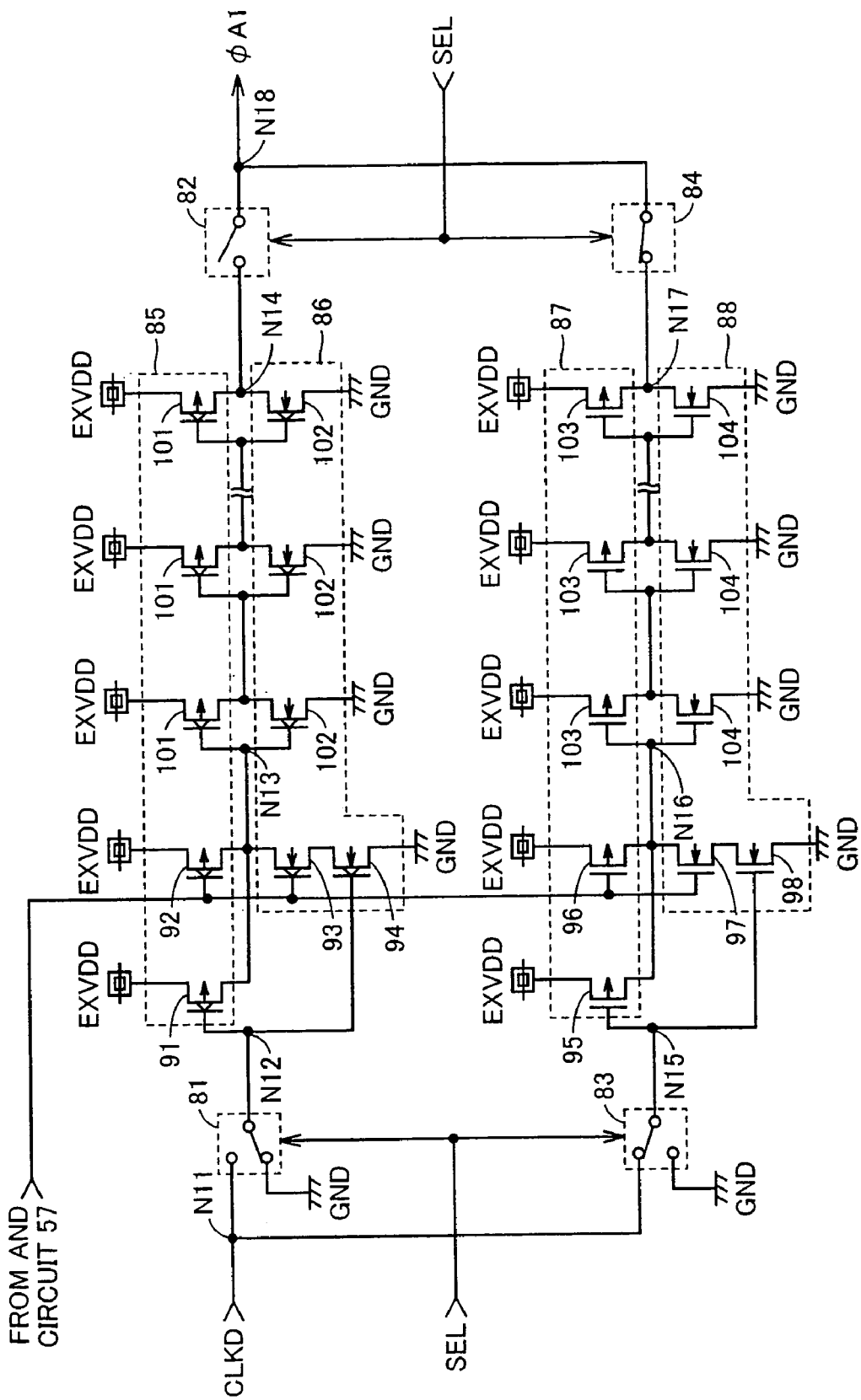
FIG. 4 is a circuit diagram specifically showing a configuration of a unit circuit of a clock driver 53 shown in FIG. 2.

With reference to FIG. 4, the clock driver 53 unit circuit includes switch circuits 81-84, P channel MOS transistor groups 85 and 87, and N channel MOS transistor groups 86 and 88.

Switch circuits 81-84 are controlled by an external select signal SEL. When external power supply potential EXVDD is low (e.g., 1.8V) select signal SEL is set low. When external power supply potential EXVDD is high (e.g., 3.0V) select signal SEL is set high. Switch circuit 81 operates for select signal SEL having the low level to connect a line of ground potential GND and a node N12. For select signal SEL having the high level, switch circuit 81 connects nodes N11 and N12. Switch circuit 82 operates for select signal SEL having the low level to disconnect output nodes N14 and N18 from each other. For select signal SEL having the high level, switch circuit 82 connects output nodes N14 and N18. Switch circuit 83 operates for select signal SEL having the low level to connect nodes N11 and N15. For select signal SEL having the low level, switch circuit 83 connects a line of ground potential GND and node N15. Switch circuit 84 operates for select signal SEL having the low level to connect output nodes N17 and N18. For select signal SEL having the high level, switch circuit 84 disconnects output nodes N17 and N18 from each other.

P channel MOS transistor group 85 includes P channel MOS transistors 91 and 92 and a plurality of P channel MOS transistors 101. N channel MOS transistor group 86 includes N channel MOS transistors 93 and 94 and a plurality of N channel MOS transistors 102. P and N channel MOS transistors 101 and 102 are equal in number.

P channel MOS transistors 91 and 92 are each connected between a line of external power supply potential EXVDD and a node N13. N channel MOS transistors 93 and 94 are connected in series between node N13 and a line of ground potential GND. P and N channel MOS transistors 91 and 94 have their respective gates both connected to node N12. P and N channel MOS transistors 92 and 93 have their respective gates both receiving a signal output from AND circuit 57. P and N channel MOS transistors 101 and 102 are connected in series between a line of external power supply potential EXVDD and a line of ground potential GND. P and N channel MOS transistors 101 and 102 form a plurality of pairs configuring inverters, respectively. These inverters are connected in series between node N13 and output node N14.

P channel MOS transistor group 87 includes P channel MOS transistors 95 and 96 and a plurality of P channel MOS transistors 103. N channel MOS transistor group 88 includes N channel MOS transistors 97 and 98 and a plurality of N channel MOS transistors 104. P and N channel MOS transistors 103 and 104 are equal in number.

P channel MOS transistors 95 and 96 are each connected between a line of external power supply potential EXVDD and a node N16. N channel MOS transistors 97 and 98 are connected in series between node N16 and a line of ground potential GND. P and N channel MOS transistors 95 and 98 have their respective gates both connected to node N15. P and N channel MOS transistors 96 and 97 have their respective gates both receiving a signal output from AND circuit 57. P and N channel MOS transistors 103 and 104 are connected in series between a line of external power supply potential EXVDD and a line of ground potential GND. P and N channel MOS transistors 103 and 104 form a plurality of pairs configuring inverters, respectively. These inverters are connected in series between node N16 and output node N17.

Note that P channel MOS transistors 91, 92, 101 and N channel MOS transistors 93, 94, 102 have a thick oxide film and they are suitable for high external power supply potential EXVDD (for example of 3V). P channel MOS transistors 95, 96, 103 and N channel MOS transistors 97, 98, 104 have a thin oxide film and they are suitable for low external power supply potential EXVDD (for example of 1.8V). Thus transistor groups 85 and 86 configured of transistors having a thick oxide film and transistor groups 87 and 88 configured of transistors having a thin oxide film are provided and selectively used depending on the external power supply potential EXVDD level.

More specifically, if external power supply potential EXVDD is high (e.g., 3V), select signal SEL is set high and clock signal CLKD is transmitted via inverters of a plurality of stages configured of P and N channel MOS transistor groups 85 and 86, respectively, and output at output node N18 as clock signal φA1. If external power supply potential EXVDD is low (e.g., 1.8V) select signal. SEL is set low and clock signal CLKD is transmitted via inverters of a plurality of stages configured of P and N channel MOS transistor groups 87 and 88, respectively, and output at output node N18 as clock signal φA1.

Figure 5:
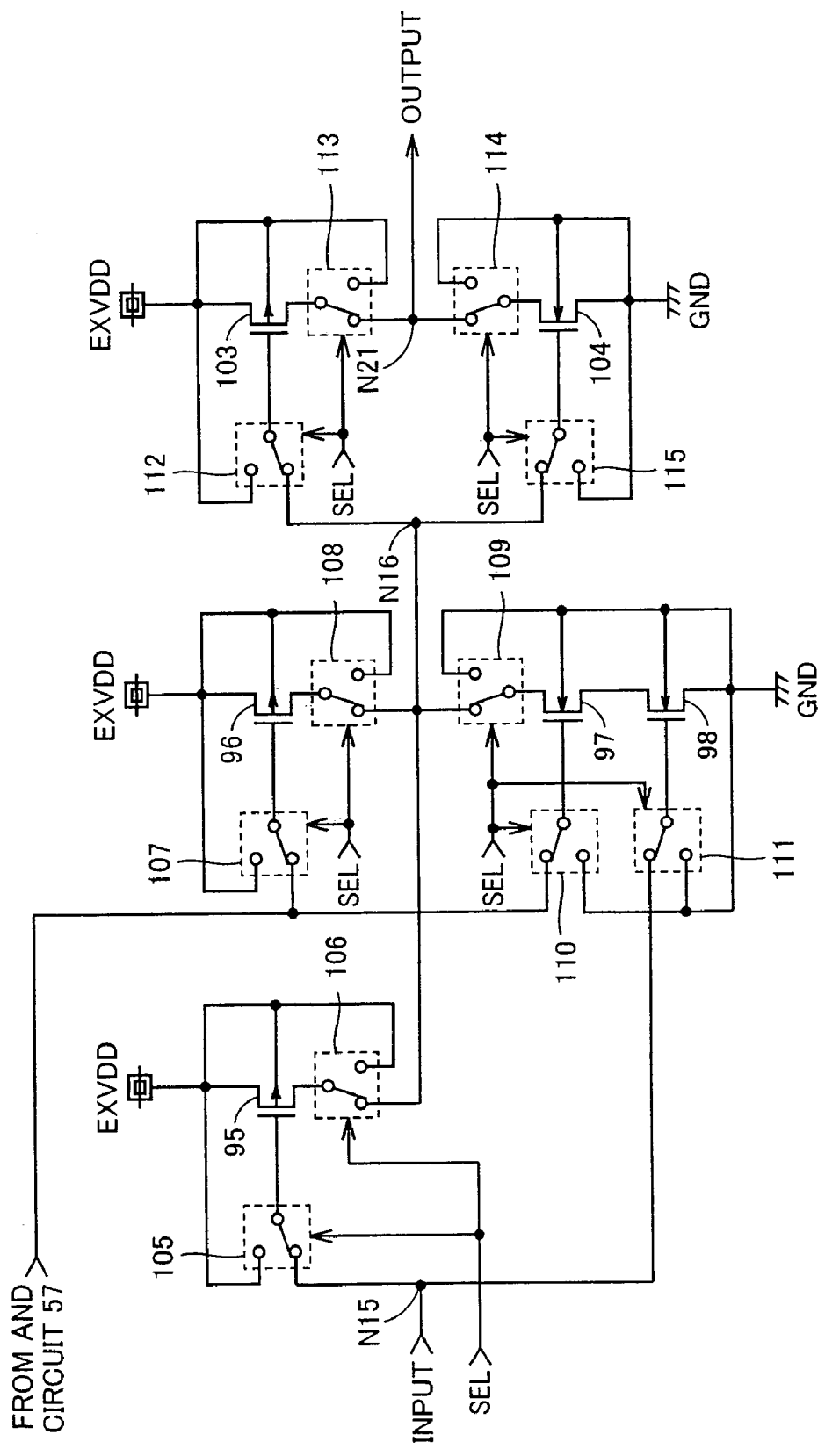
FIG. 5 is a circuit diagram more specifically showing a configuration of a P channel MOS transistor group 87 and an N channel MOS transistor group 88 shown in FIG. 4.

FIG. 5 is a circuit diagram more specifically showing a configuration of P and N channel MOS transistor groups 87 and 88 shown in FIG. 4. With reference to the figure, P channel MOS transistors 95, 96, 93 have their respective gates provided with switch circuits 105, 107, 112. P channel MOS transistors 95, 96, 103 have their respective drains provided with switch circuits 106, 108, 113. N channel MOS transistors 97, 104 have their respective drains provided with switch circuits 109, 114. N channel MOS transistors 97, 98, 104 have their respective gates provided with switch circuits 110, 111, 115. Switch circuits 105-115 are controlled by select signal SEL.

When select signal SEL has the low level (or external power supply potential EXVDD is low) switch circuit 105 connects node N15 and the P channel MOS transistor 95 gate. Switch circuit 106 connects the P channel MOS transistor 95 drain and node N16. Switch circuit 107 connects the AND circuit 57 output node and the P channel MOS transistor 96 gate. Switch circuit 108 connects the P channel MOS transistor 96 drain and node N16. Switch circuit 109 connects node N16 and the N channel MOS transistor 97 drain. Switch circuit 110 connects the AND circuit 57 output node and the N channel MOS transistor 97 gate. Switch circuit 111 connects node N15 and the N channel MOS transistor 98 gate. As such, if AND circuit 57 outputs a signal of the high level, P channel MOS transistor 96 turns off and N channel MOS transistor 97 turns on, and a clock signal transmitted to node N15 has its logic level inverted and thus provided to node N16. If AND circuit 57 outputs a signal of the low level, P channel MOS transistor 96 turns on and N channel MOS transistor 97 turns off, and node N16 is fixed high and a clock signal transmitted to node N15 is not transmitted to node N16.

If select signal SEL has the high level (or external power supply potential EXVDD is high) switch circuit 105 connects a line of external power supply potential EXVDD and the P channel MOS transistor 95 gate. Switch circuit 106 connects the P channel MOS transistor 95 drain and a line of external power supply potential EXVDD. Switch circuit 107 connects a line of external power supply potential EXVDD and the P channel MOS transistor 96 gate. Switch circuit 108 connects the P channel MOS transistor 96 drain and a line of external power supply potential EXVDD. Switch circuit 109 connects a line of ground potential GND and the N channel MOS transistor 97 drain. Switch circuit 110 connects a line of ground potential GND and the N channel MOS transistor 97 gate. Switch circuit 111 connects a line of ground potential GND and the N channel MOS transistor 98 gate.

Thus P channel MOS transistors 95, 96 have their sources, drains and gates all connected to line of external power supply potential EXVDD. Furthermore, the N channel MOS transistor 97 drain and gate and the N channel MOS transistor 98 source and gate are both connected to line of ground potential GND. P channel MOS transistors 95, 96 and N channel MOS transistors 97 and 98 are turned off to prevent high external power supply potential EXVDD from impairing MOS transistor.

Furthermore, if select signal SEL has the high level (or external power supply potential EXVDD is low) switch circuit 112 connects node N16 and the P channel MOS transistor 103 gate. Switch circuit 113 connects the P channel MOS transistor 103 drain and a node N21. Switch circuit 114 connects node N21 and the N channel MOS transistor 104 drain. Switch circuit 115 connects node N16 and the N channel MOS transistor 104 gate. Thus a clock signal transmitted to node N16 is inverted in logic level and thus provided to node N21.

If select signal SEL has the high level (or external power supply potential EXVDD is high) select circuit 112 connects a line of external power supply potential EXVDD and the P channel MOS transistor 103 gate. Switch circuit 113 connects the N channel MOS transistor 103 drain and a line of external power supply potential EXVDD. Switch circuit 114 connects a line of ground potential GND and the N channel MOS transistor 104 drain. Switch circuit 115 connects a line of ground potential GND and the N channel MOS transistor 104 gate.

Thus P channel MOS transistor 103 has its source, drain and gate all connected to line of external power supply potential EXVDD. Furthermore N channel MOS transistor 104 has its source, drain and gate all connected to line of ground potential GND. As such, P and N channel MOS transistors 103 and 104 are turned off to prevent high external power supply potential EXVDD from impairing MOS transistors.

Thus P and N channel MOS transistor groups 87 and 88 include MOS transistors switched to prevent high external power supply potential EXVDD from being applied to and thus impairing MOS transistors.

Note that while switch circuits 81-84 and 105-115 have been described as switch circuits switched by select signal SEL, switch circuits 81-84 and 105-115 may alternatively be switch circuits having an aluminum (A1) interconnect path switched by changing a mask.

Figure 6:
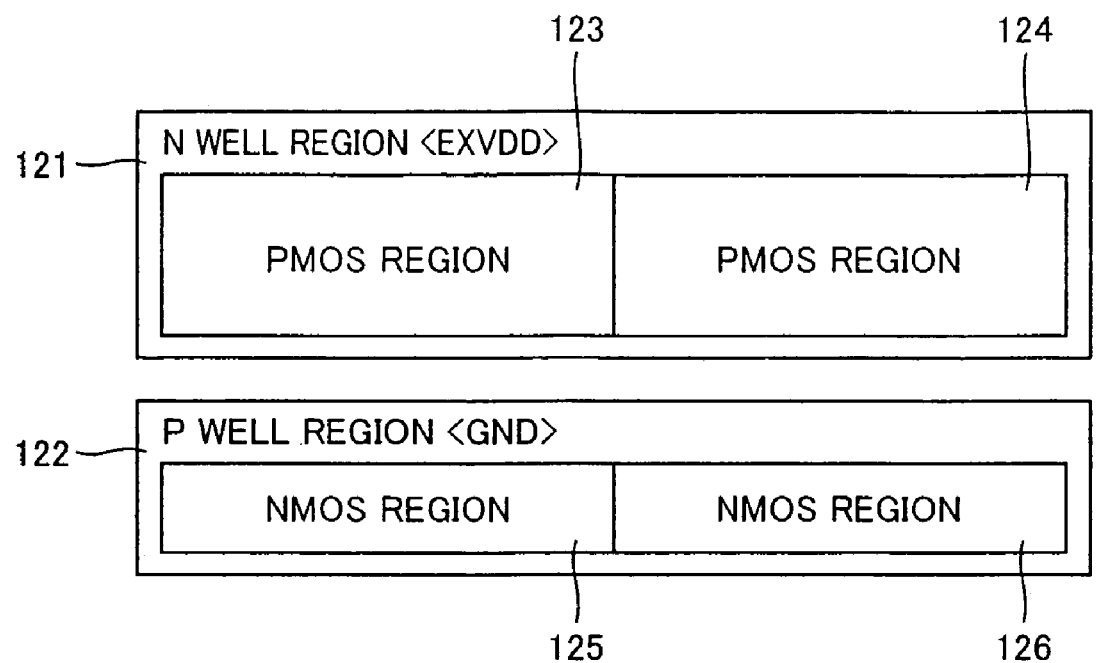
FIG. 6 is a layout for illustrating an arrangement of P channel MOS transistor groups 85, 87 and N channel MOS transistor groups 86, 88 shown in FIG. 4.

FIG. 6 is a layout for illustrating an arrangement of P channel MOS transistor groups 85, 87 and N channel MOS transistor groups 86, 88 shown in FIG. 4. In the figure, an N well region 121 is connected to a line of external power supply potential EXVDD and a P well region 122 is connected to a line of ground potential GND.

N well region 121 has PMOS regions 123, 124 arranged therein. PMOS region 123 has arranged therein P channel MOS transistors 91, 92 and the plurality of P channel MOS transistors 101 shown in FIG. 4. PMOS region 124 has arranged therein P channel MOS transistors 95, 96 and the plurality of P channel MOS transistors 103 shown in FIG. 4.

P well region 122 underlies MOS regions 125, 126. NMOS region 125 has arranged therein N channel MOS transistors 93, 94 and the plurality of N channel MOS transistors 102 shown in FIG. 4. NMOS region 126 has arranged therein N channel MOS transistors 97, 98 and the plurality of N channel MOS transistors 104 shown in FIG. 4.

For conventional clock drivers, N well region 121 is separated in two and PMOS regions 123 and 124 are arranged on separate N well regions, since P and N channel MOS transistor groups 87 and 88 are not provided with switch circuits 105-115. In that case when external power supply potential EXVDD is high node N15 is set low and P channel MOS transistor 95 turns on. P channel MOS transistor 95, with a thin oxide film, receives high external power supply potential EXVDD, and transistor may be impaired. Accordingly, the N well region having PMOS region 123 arranged therein and that having PMOS region 124 arranged therein are separated. This allows the N well region with PMOS region 123 to receive a high external power supply potential EXVDDH and that with PMOS region 124 to receive a low internal power supply potential EXVDDL. This configuration, however, requires a space at a boundary of the two N well regions and hence an increased layout area for the clock driver.

Accordingly in the present embodiment P and N channel MOS transistor groups 87 and 88 are provided with switch circuits 105-115 and PMOS regions 123 and 124 are arranged on a single N well region 121. The clock driver's layout area can thus be reduced.

Note that the FIG. 6 layout shows an arrangement of a transistor of a unit circuit of clock driver 53 shown in FIG. 4, and clock driver 53 is provided with a plurality of such unit circuits. For example if charge pump 55 has a 10-stage configuration, the number of unit circuits is twice that of the stages of pump portions, i.e., 20 unit circuits are provided. As such in the present embodiment a clock driver can be provided with unit circuits each having a reduced layout area and as a result the clock driver's entire layout area can significantly be reduced.

With reference again to FIG. 2 clock drivers 53, 63, 64 are similar in configuration and operation to clock driver 53. Clock driver 54 is activated for a signal of the high level output from AND circuit 58 to amplify a clock signal output from inverter 51 in current to generate a 4-phase clock signal /φA1-/φA4 and provide the signal to charge pump 56. If AND circuit 58 outputs a signal of the low level, clock driver 54 is inactivated and does not transmit a clock signal output from inverter 51. Clock driver 63 is activated for a signal of the high level output from AND circuit 67 to amplify clock signal CLK received from clock generation circuit 1 in current to generate a 4-phase clock signal φB1-/φB4 and provide the signal to charge pump 65. If AND circuit 67 outputs a signal of the low level, clock driver 63 is inactivated and does not transmit clock signal CLK received from clock generation circuit 1. Clock driver 64 is activated for a signal of the high level output form AND circuit 68 to amplify a clock signal output from inverter 61 in current to generate 4-phase clock signal /φB1-/φB4 and provide the signal to charge pump 66. If AND circuit 68 outputs a signal of the low level, clock driver 64 is inactivated and does not transmit a clock signal output from inverter 61.

Charge pump 55 is driven by clock signal φA1-φA4 output from clock driver 53 to generate and provide potential VPB to output node N1. Charge pump 56 is driven by clock signal /φA1-/φA4 output from clock driver 54 to generate and provide potential VPB to output node N1. Charge pump 65 is driven by clock signal φB1-φB4 output from clock driver 63 to generate and provide potential VPW to output node N2. Charge pump 66 is driven by clock signal /φB1-φB4 output from clock driver 64 to generate and provide potential VPW to output node N2.

Figure 7:
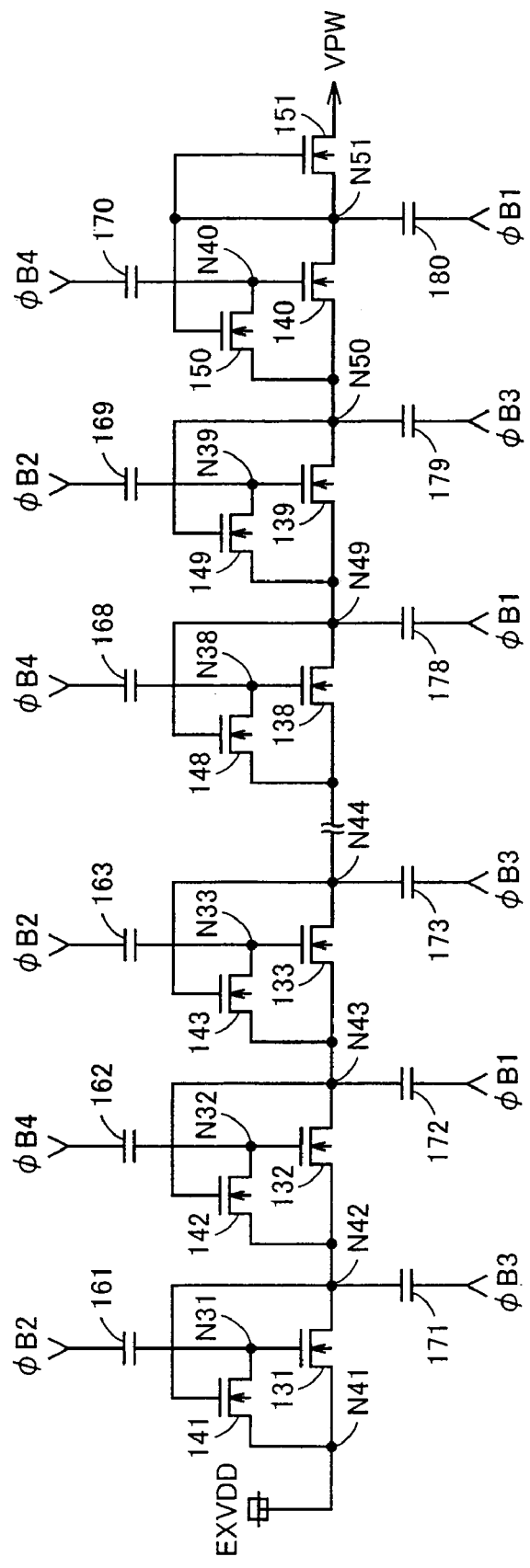
FIG. 7 is a circuit diagram showing a configuration of a charge pump 65 shown in FIG. 2.

Charge pump 65 will more specifically be described in configuration and operation. With reference to FIG. 7, charge pump 65 includes N channel MOS transistors 131-151 and capacitors 161-180.

N channel MOS transistors 131-140 are connected in series between a line of external power supply potential EXVDD and a node N51. N channel MOS transistors 131-140 have their gates connected to nodes N31-N40, respectively. N channel MOS transistors 141-150 are connected between nodes N41-N50 and nodes N31-N40, respectively. N channel MOS transistors 141-150 have their gates connected to nodes N42-N51, respectively. N channel MOS transistor 51 has its drain and gate connected to node N51 to configure a diode. N channel MOS transistor 151 has a source outputting potential VPW.

The odd numbered capacitors 161-169 have their-respective one electrodes receiving clock signal φB2 from clock driver 63 and their respective other electrodes connected to the odd numbered nodes N31-N39. The even numbered capacitors 162-170 have their respective one electrodes receiving clock signal φB4 from clock driver 63 and their respective other electrodes connected to the even numbered nodes N32-N40. The odd numbered capacitors 171-179 have their respective one electrodes receiving clock signal φB3 from clock driver 63 and their respective other electrodes connected to the even-numbered nodes N42-N50. The even numbered capacitors 172-180 have their respective one electrodes receiving clock signal φB1 from clock driver 63 and have their respective other electrodes connected to the odd numbered nodes N43-N51. Charge pump 65 thus has a 10-stage pump configuration.

Figure 8:
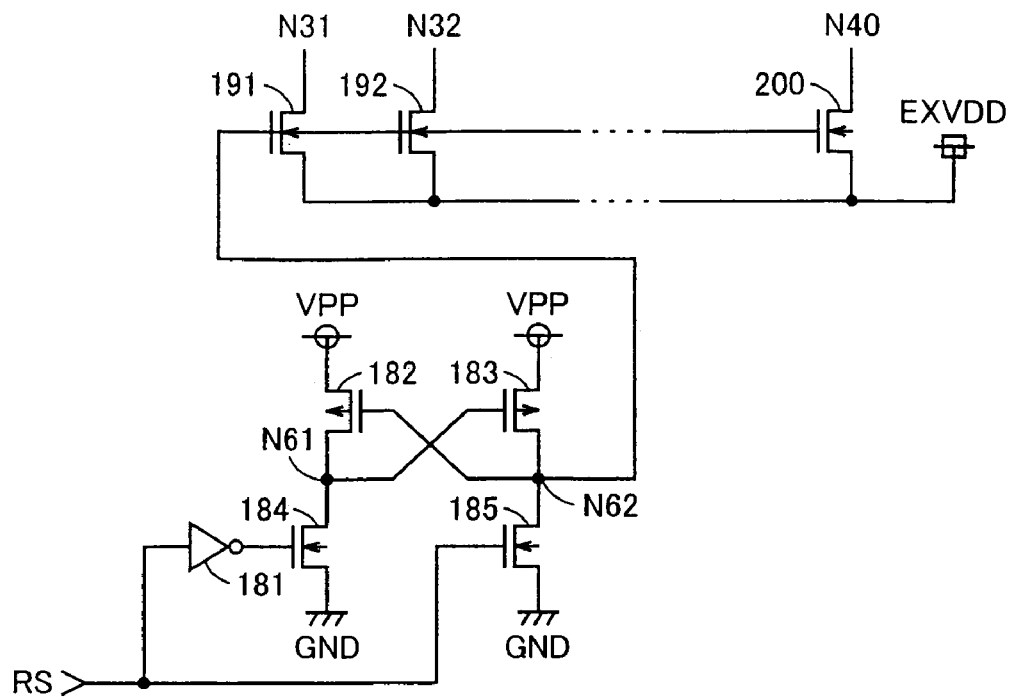
FIG. 8 is a circuit diagram showing a configuration for resetting a potential of nodes N31-N40 of a charge pump shown in FIG. 7.

FIG. 8 is a circuit diagram showing a configuration for resetting a potential of nodes N31-N40 of the FIG. 7 charge pump 65. With reference to the figure, charge pump 65 further includes an inverter 181, P channel MOS transistors 182, 183, and N channel MOS transistors 184, 185, 191-200.

P and N channel MOS transistors 182 and 184 are connected in series between a line of potential VPP (or a potential output from the positive pump circuit for normal operation 11) and a line of ground potential GND. P channel MOS transistor 182 has its gate connected to output a node N62. N channel MOS transistor 184 has its gate receiving a reset signal RS externally via inverter 181. P and N channel MOS transistors 183 and 185 are connected in series between a line of potential VPP (a potential output from the positive pump circuit for normal operation 11) and a line of ground potential GND. P channel MOS transistor 183 has its gate connected to a node N61. N channel MOS transistor 185 has a gate receiving external reset signal RS.

N channel MOS transistors 191-200 are connected between nodes N31-N40 shown in FIG. 7, respectively, and a line of external power supply potential EXVDD. N channel MOS transistors 191-200 have their gates connected in common to output node N61.

Figure 9:
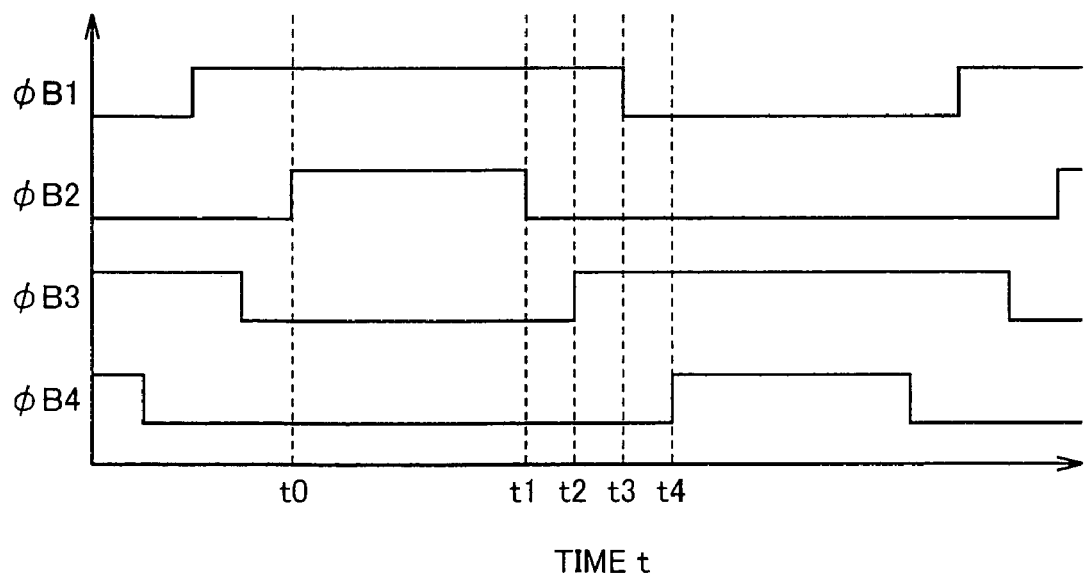
FIG. 9 is timing plots for illustrating an operation of the FIG. 7 charge pump.

FIG. 9 is timing plots for illustrating an operation of charge pump 65. With reference to the figure, clocks signals φB1-φB4 are signals provided from clock driver 63.

With reference to the timing plots a pump portion of the 10th stage shown in FIG. 7 operates as will be described hereinafter. From time t0 through time t1 clock signals φB1, φB2 are set high, node N49 has its electric charge transferred to node N50, and node N50 is charged to a high potential. At time t1 clock signal φB2 is pulled low and in response N channel MOS transistor 139 turns off and nodes N49 and N50 are electrically disconnected. Then at time t2 clock signal φB3 is pulled high and in response node N50 increases in potential. As clock signal φB1 has the high level and N channel MOS transistor 150 has responsively been turned on, node N50 has its electric charge transferred to node N40, and node N40 is charged to a high potential. At time t3 clock signal φB1 is pulled low and in response N channel MOS transistor 150 turns off and nodes N50 and N44 are electrically disconnected. Then at time t4 clock signal φB4 is pulled high and in response N channel MOS transistor 140 turns on, when the node N40 potential having been charged to the high potential further increases and N channel MOS transistor 140 thus has its transferring ability increased, and node N50 has its electric charge transferred to node N51 without being affected by a threshold voltage of N channel MOS transistor 140. The first to ninth stages' pump portions similarly operate and nodes N41-N51 sequentially increase in potential.

If the diode configuring N channel MOS transistor 151 has a threshold voltage Vt then the node N51 potential, i.e., the 10th stage's pump portion outputs a potential VPW+Vth. As such, if an i-th stage's pump portion outputs a potential Vi then the following expression:

$$Vj = EXVDD + i(VPW + Vth - EXVDD)/10 \qquad (1)$$

is established.

Nodes N31-N40 each associated with a stage's pump portion are set higher in potential than potential Vi output from the stage's pump portion. Let us consider that the positive pump circuit for internal operation 13 performs a pumping operation once stopped and thereafter resumed for the sake of illustration. More specifically, with reference to FIG. 1, external application select circuit 23 selects and outputs potential VPP (for example of 5.5V) output from the positive pump circuit for normal operation 11 and external application select circuit 25 selects and outputs potential VPW (for example of 9.7V) output from the positive pump circuit for internal operation 13, and in that condition the positive pump circuit 13 operation is stopped and reset circuit 30 provides an output node of external application select circuit 24 with potential VPP (for example of 5.5V) output from external application select circuit 23. Subsequently, the positive pump circuit 13 operation is resumed to again generate potential VPW (for example of 9.7V).

In that case, with reference to FIG. 7, charge pump 65 outputs a potential reset from VPW (for example of 9.7V) to VPP (for example of 5.5V). Node N51 has been set at a high potential (for example of 5.5V+Vth). As there still remains high potential at node N40, N channel MOS transistor 140 turns on, and node N50 is brought to the same high potential as node N51 (for example of 5.5V+Vth). N channel MOS transistor 150 is turned on receiving the high potential of node N51 at its gate. As such, when charge pump 65 outputs a potential reset from VPW (for example of 9.7V) to VPP (for example of 5.5V) the node N40 potential decreases due to coupling. At node N40, however, there still remains a high potential of external power supply potential EXVDD (for example 1.8V) or more. The ninth stage's pump portion is similar to the tenth stage's pump portion, and node N49 is brought to the same high potential as node N50 and at node N39 there still remains a high potential of external power supply potential EXVDD (for example 1.8V) or more. Initial stages' pump portions do not have high potential applied thereto, and when the charge pump 65 output potential is reset from VPW (for example of 9.7V) to VPP (for example of 5.5V) the nodes N31, B32, . . . potential decrease due to coupling to be lower than external power supply potential EXVDD (for example of 1.8V).

If in this condition the positive pump circuit 13 operation is resumed to again generate positive potential VPW (for example of 9.7V) the ninth and tenth pump portions' nodes N39 and N40 still have a potential higher than external power supply potential EXVDD (for example of 1.8V), and N channel MOS transistors 139, 140 are turned on and there is not rectification effect. In other words, succeeding stages' pump portions cannot pump and the charge pump 65 pumping ability drops. To prevent such disadvantage, the FIG. 8 circuit is provided.

With reference to FIG. 8, reset signal RS is set high and low when the positive pump circuit for internal operation 13 operates and does not operate, respectively. When reset signal RS has the high level, N channel MOS transistor 184 turns off and N channel MOS transistor 185 turns on. In response, output node N62 is set low and P channel MOS transistor 182 turns on. As such, node N61 is set high and P channel MOS transistor 183 turns off, when in response to output node N62 having been set low N channel MOS transistors 191-200 turn off.

When reset signal RS has the low level, N channel MOS transistor 184 turns on and N channel MOS transistor 185 turns off. In response, node N61 is set low and P channel MOS transistor 183 turns on. As such, output node N62 is set high and P channel MOS transistor 182 turns off, when in response to output node N62 having been set high N channel MOS transistors 191-200 turn on. As such, nodes N31-N40 are reset in potential to external power supply potential EXVDD (for example of 1.8V). As such, if the positive pump circuit 13 operation is resumed to again generate positive potential VPW (for example of 9.7V), with the ninth and tenth pump portions' nodes N39 and N40 without a potential higher than external power supply potential EXVDD (for example of 1.8V), the N channel MOS transistors 139, 140 rectification effect has been recovered. In other words, succeeding pump portions' failure to pump can be resolved and charge pump 65 can be prevented from having an impaired pumping ability.

Figure 10:
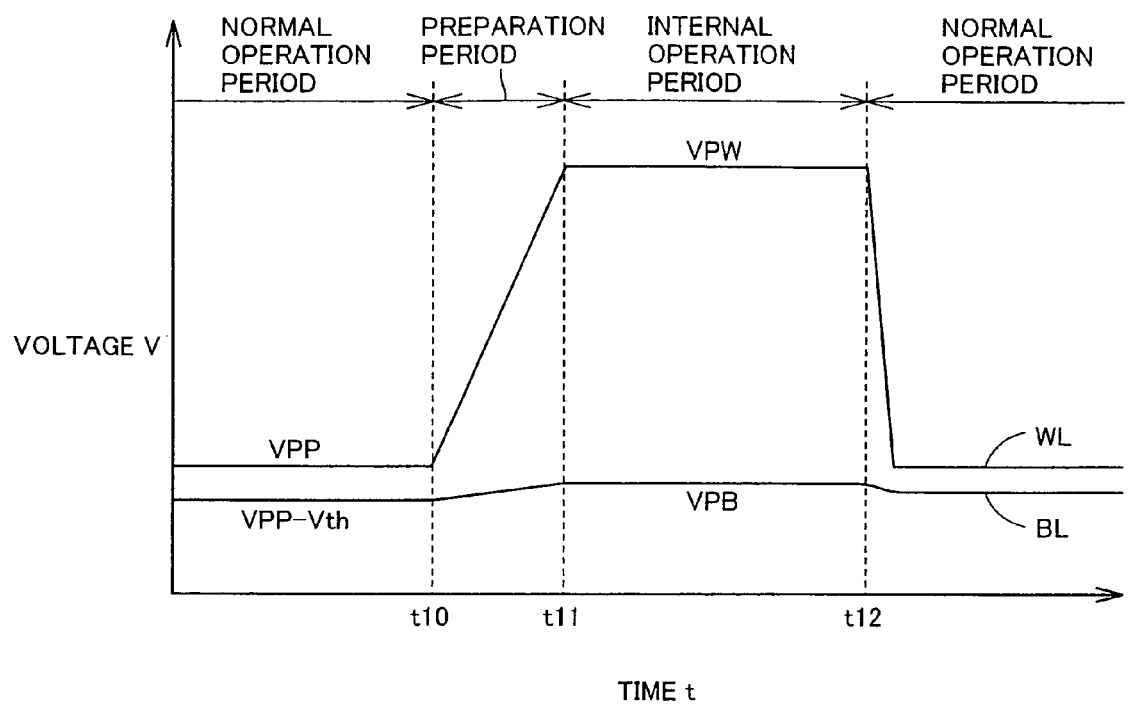
FIG. 10 is timing plots for illustrating a variation in potential of bit and word lines BL and WL of a memory portion shown in FIG. 1.

Then with reference again to FIG. 1 the positive pump circuits for internal operation 12 and 13 are operated to control the memory portion 42 bit and word lines BL and WL in potential, as will be described hereinafter. FIG. 10 is a timing plot for illustrating how the memory portion 42 bit and word lines BL and WL vary in potential. With reference to the figure, in a normal operation period a read or similar normal operation is performed. In an internal operation period a programming or similar internal operation is performed. In a preparation period a preparation is made for transitioning from a normal operation state to an internal operation state.

With reference to FIGS. 1, 2 and 10 in a normal operation period prior to time t10 the positive pump circuit for normal operation 11 generates positive potential VPP (for example of 5.5V). External application select circuit 23 selects and outputs potential VPP provided from the positive pump circuit for normal operation 11. Select circuit 34 selects potential VPP output from external application select circuit 23 and provides the potential to word line driver 39. The memory portion 42 word line WL has its potential brought by word line driver 39 to VPP. The positive pump circuits for internal operation 12, 13 have been inactivated. Reset circuit 29 provides an output node of external application select circuit 24 with potential VPP output from external application select circuit 23 minus transistor threshold voltage Vth, i.e., a potential VPP−Vth. The memory portion 42 bit line BL has its potential brought by write circuit 38 to potential VPP−Vth.

At time t10 enable signals EN1-EN4 are set to the high level of the activation level. In response to enable signal EN1 having been set to the high level of the activation level divider circuit portion 3 divides clock signal CLK output from clock generation circuit 1 to output clock signal CLKD. Furthermore in response to enable signals EN2-EN4 having been set to the high level of the activation level the positive pump circuits for internal operation 12, 13 are activated. External application select circuit 24 selects and outputs a potential output from the positive pump circuit for internal operation 12. External application select circuit 25 selects and outputs to write circuit 38 a potential output from the positive pump circuit for internal operation 13. Reset circuits 29 and 30 do not perform a reset operation as the positive pump circuits for internal operation 12, 13 are activated. Select circuit 34 selects a potential output from external application select circuit 25 and provides the potential to word line driver 39. The memory portion 42 word line WL is provided with the potential output from the positive pump circuit for internal operation 13. Furthermore the memory portion 42 bit line BL is provided with the potential output from the positive pump circuit for internal operation 12. From time t10 through time t11 a preparation is made for transitioning from a normal operation period to an internal operation period.

At time t11 the word line WL potential is set by the positive pump circuit for internal operation 13 to a prescribed potential VPW (for example of 9.7V) and the bit line BL potential is set by the positive pump circuit for internal operation 12 to a prescribed potential VPB (for example of 5.1V). Furthermore at time t11 enable signals EN1 and EN4 are set to the low level of the inactivation level. In response to enable signal EN1 having been set to the low level of the inactivation level divider circuit portion 3 outputs clock signal CLK, received from clock generation circuit 1, as clock signal CLKD, rather than dividing clock signal CLK. This allows an increased drive ability of the positive pump circuit for internal operation 12. Furthermore in response to enable signal EN4 having been set to the low level of the inactivation level the positive pump circuit for internal operation 13 clock driver 64 is inactivated and the positive pump circuit for internal operation 13 has its drive ability halved.

At time t12 enable signals EN2 and EN3 are set to the low level of the inactivation level. In response the positive pump circuits for internal operation 12, 13 are inactivated. Furthermore select circuit 34 selects potential VPP output from external application select circuit 23 and provides the potential to word line driver 39. The memory portion 42 word line WL has its potential brought by word line driver 39 VPP. Reset circuit 29 provides the output node of external application select circuit 24 with potential VPP output from external application select circuit 23 minus transistor threshold voltage Vth, i.e., a potential VPP−Vth. The memory portion 42 bit line BL has its potential brought by write circuit 38 to potential VPP−Vth.

Thus at time t11 the positive pump circuits for internal operation 12, 13 has a drive ability switched. After word line WL is raised to the prescribed potential VPW (for example 9.7V) its current consumption is reduced. As such, before time t11 the positive pump circuit for internal operation 1 clock drivers 63 and 64 and charge pumps 65 and 66 are activated and after t11 clock driver 63 and charge pump 65 alone are activated. Furthermore, after bit line BL is raised to the prescribed potential VPB (for example of 5.1V) the bit line requires a large write current. Accordingly before time t11 divider circuit portion 3 divides clock signal CLK and by clock signal CLKD of a low frequency the bit line BL potential is gradually raised to the prescribed potential VPB (for example of 5.5V). The clock signal CLKD frequency is reduced to prevent the bit line BL potential from being higher than the prescribed potential VPB. After time t11, clock signal CLK is not divided, and by clock signal CLKD of high frequency the bit line BL potential is held at VPB. As such, a pumping operation is appropriately controlled in accordance with state and the word line WL potential is prevented from rippling. Furthermore, the bit line BL write current's peak value is reduced.

Note that with reference to FIG. 2 the positive pump circuit for internal operation 12 is provided with inverter 51 in order to provide clock drivers 53 and 54 with complementary clock signals. Two charge pumps 55 and 56 thus alternately, continuously generate voltage. The positive pump circuit for internal operation 13 is also similarly provided with inverter 61 and two charge pumps 65 and 66 alternately, continuously generate voltage. As such, pump circuits for internal operation 12 and 13 output potentials VPB, VPW with limited ripple.

While the positive pump circuits for internal operation 12, 13 each is provided with two pairs of a clock driver and a charge pump for the sake of illustration, the circuit may be provided with any number of pairs of a clock driver and a charge pump. Different numbers of such pairs allow the pump circuit to have different drive ability.

Figure 11:
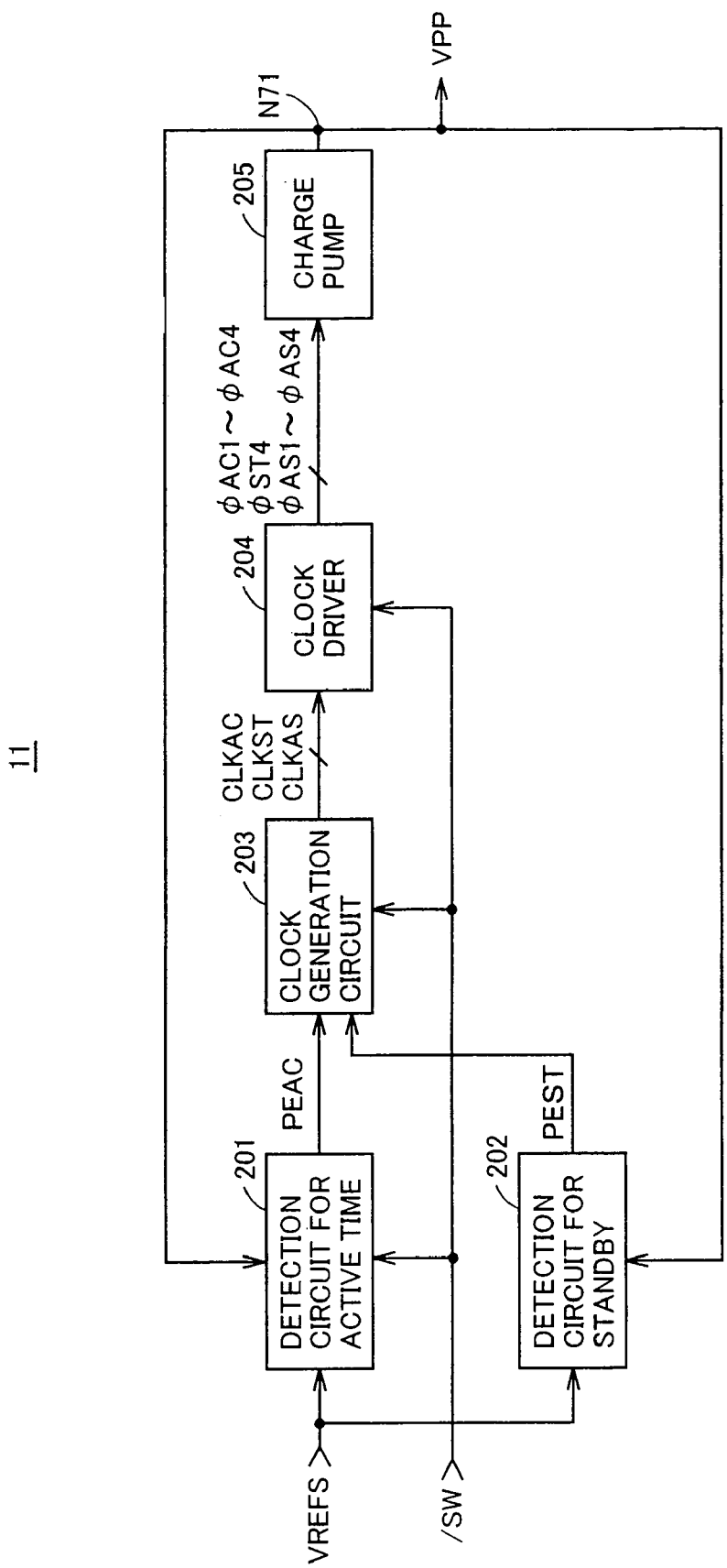
FIG. 11 is a block diagram showing a configuration of a positive pump circuit for normal operation shown in FIG. 1.

With reference to FIG. 11 the positive pump circuit for normal operation 111 includes a detection circuit for active time 201, a detection circuit for standby 202, a clock generation circuit 203, a clock driver 204 and a charge pump 205.

The detection circuit for active time 201 and the detection circuit for standby 202 are similar in configuration and operation to the FIG. 3 detection circuit 52. It should be noted, however, that the detection circuit for active time 201 receives a switch signal /SW set to the low level of the activation level in an active time consuming a large amount of current (or in a state of operation with an internal circuit in operation) and set to the high level of the inactivation level in a standby time consuming a small amount of current (or in a standby state with the internal circuit not in operation).

The detection circuit for active time 201 operates for switch signal /SW having the low level of the activation level to output to clock generation circuit 203 a detection signal PEAC based on reference potential VREFS provided from reference potential generation circuit 4 and potential VPP provided from an output node N71. More specifically, potential VPP having been divided by an internal resistor is compared with reference potential VREFS and if potential VPP is lower than a target level detection signal PEAC is set high. If potential VPP is higher than the target level detection signal PEAC is set low. Furthermore if switch signal /SW has the high level of the inactivation level detection signal PEAC is set high.

The detection circuit for standby 202 outputs to clock generation circuit 203 a detection signal PEST based on reference potential VREFS provided from reference potential generation circuit 4 and potential VPP provided from output node N71. More specifically, potential VPP having been divided by internal resistor is compared with reference potential VREFS and if potential VPP is lower than a target level a detection signal PEST output is set high. If potential VPP is higher than the target level detection signal PEST output is set low.

From detection signals PEAC and PEST output from the detection circuits for active time and standby 201 and 202, respectively, clock generation circuit 203 generates a clock signal for active time CLKAC, a clock signal for standby CLKST, and a common clock signal CLKAS. For switch signal /SW having the high level, clock generation circuit 203 operates in response to detection signal PEAC output from detection circuit 201 to generate clock signal CLKAC and common clock signal CLKAS. For switch signal /SW having the high level, clock generation circuit 203 operates in response to detection signal PEST output from detection circuit 202 to generate clock signal CLKST and common clock signal CLKAS.

Clock driver 204 is similar in configuration and operation to clock drivers 53, 54, 63, 64 shown in FIG. 2. Clock driver 204 for switch signal /SW having the low level operates in response to clock signals CLKAC, CLKAS provided from clock generation circuit 203 to generate 4-phase clock signals φAC1-φAC4 and φAS1-φAS4. For switch signals /SW having the high level, clock driver 204 operates in response to clock signals CLKST, CLKAS output from clock generation circuit 203 to generate 4-phase clock signals φST4 and φAS1-φAS4.

Figure 12:
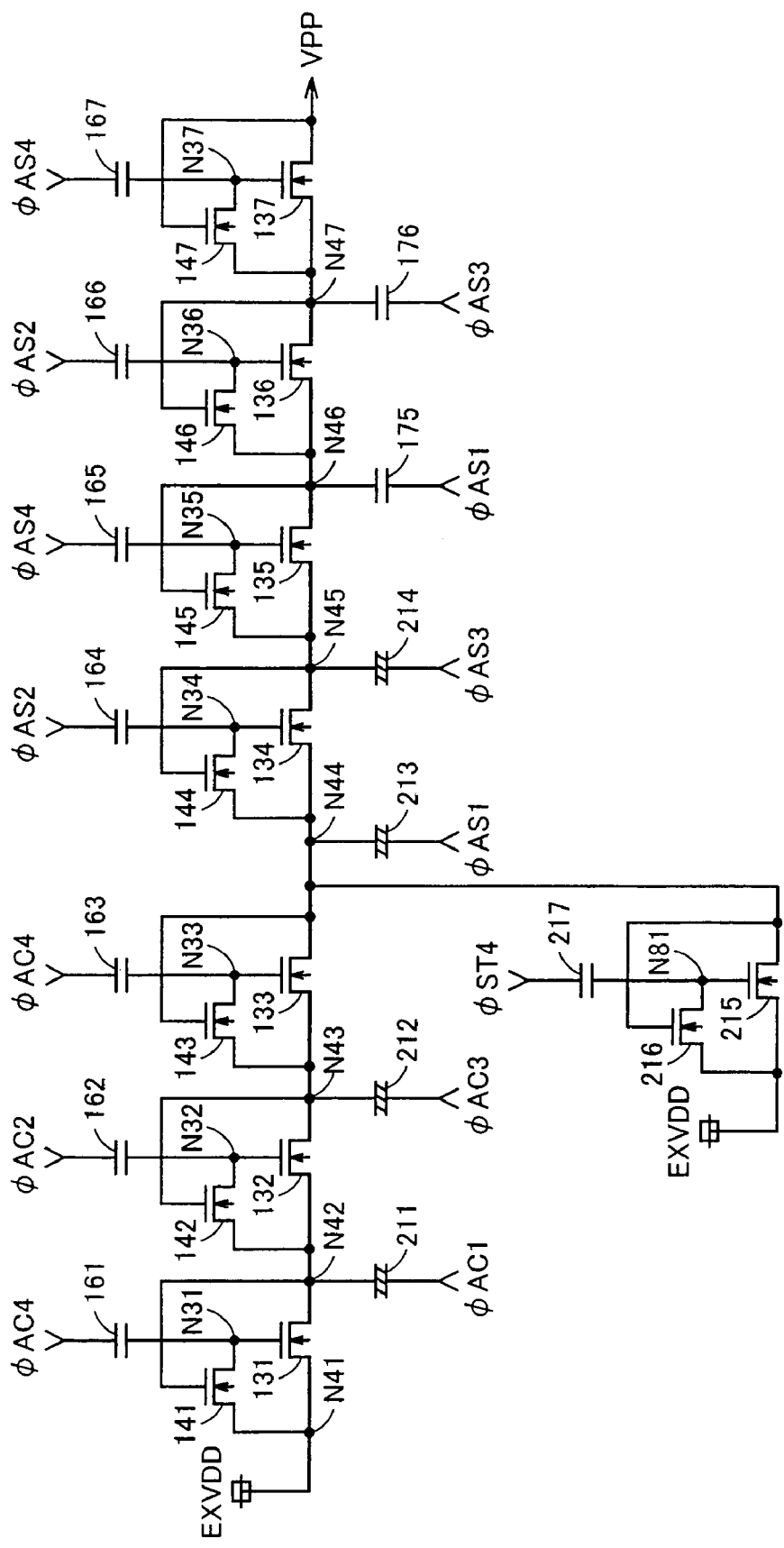
FIG. 12 is a circuit diagram showing a configuration of a charge pump shown in FIG. 11.

FIG. 12 is a circuit diagram showing a configuration of charge pump 205, as compared with FIG. 7. The FIG. 12 charge pump 205 differs from the FIG. 7 charge pump 65 in that: ten stages of pump portions are reduced to seven stages thereof; capacitors 171-174 are replaced with capacitors 211-214; N channel MOS transistors 215, 216 and a capacitor 217 are additionally introduced; and clock signals φB1-φB4 are replaced with clock signals φAC1-φAC4, φAS1-φAS4 and φST4.

N channel MOS transistor 215 is connected between a line of external power supply potential EXVDD and a node N44. N channel MOS transistor 215 has its gate connected to a node N81. N channel MOS transistor 216 is connected between a line of external power supply potential EXVDD and node N81. N channel MOS transistor 216 has its gate connected to node N44. Capacitor 214 has one electrode receiving clock signal φST4 from clock driver 204 and the other electrode connected to node N81.

Capacitors 161, 163 each have one electrode receiving clock signal φAC4. Capacitor 162 has one electrode receiving clock signal φAC2. Capacitor 211 has one electrode receiving clock signal φAC1. Capacitor 212 has one electrode receiving clock signal φAC3.

Capacitors 164, 166 each have one electrode receiving clock signal φAS2. Capacitors 165, 167 each have one electrode receiving clock signal φAS4. Capacitors 213, 175 each have one electrode receiving clock signal φAS1. Capacitors 214, 216 each have one electrode receiving clock signal φAS3. N channel MOS transistor 137 has a source outputting potential VPP.

Figure 13:
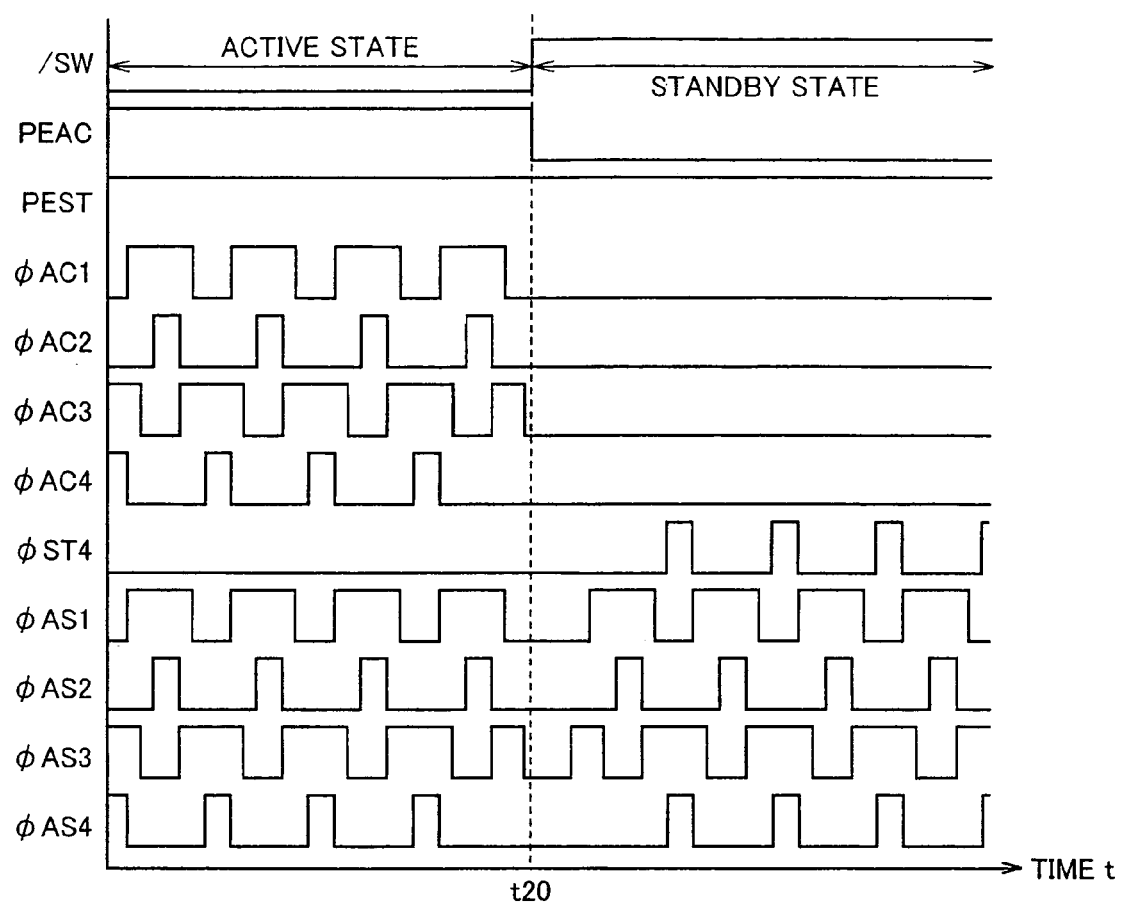
FIG. 13 is timing plots for illustrating an operation of the FIG. 11 positive pump circuit for normal operation.

FIG. 13 is timing plots for illustrating an operation of the positive pump circuit for normal operation 11. In the figure at time t20 an active state is switched to a standby state.

A period prior to time t20 switch signal /SW is set to the low level of the activation level. In response, clock generation circuit 203 operates in response to detection signal PEAC of the high level provided from detection circuit 201 to generate clock signal CLKAC for active state and common clock signal CLKAS. Clock driver 204 operates in response to clock signals CLKAC, CLKAS to generate clock signal φAC1-φAC4, φAS1-φAS4. Clock signal φST4 is set low.

Charge pump 205 is driven by clock signals φAC1-φAC4, φAS1-φAS4 to allow seven stages' pump portions to pump to generate potential VPP. This pumping operation will not specifically be described as it is similar to that of charge pump 65 shown in FIG. 7.

At time t20 switch signal /SW is pulled to the high level of the inactivation level. In response, clock generation circuit 203 operates in response to detection signal PEST of the high level provided from detection circuit 202 to generate clock signal CLKST for standby and common clock signal CLKAS. Clock driver 204 operates in response to clock signals CLKST, CLKAS to generate clock signals φST4, φAS1-φAS4. Clock signals φAC1-φAC4 are set low.

Charge pump 205 is driven by clock signals ST4, φAS1-φAS4 to allow five stages' pump portions to pump to generate potential VPP. Thus in an active state the seven stages' pump portions pump and in a standby state five stages' pump portions pump. The number of stages of pump portions operated in the standby state is smaller than that of stages of pump portions operated in the active state. Thus in the standby state the pump circuit consumes a small current.

Conventionally a charge pump for active time and that for standby are separately provided. This results in the semiconductor integrated circuit device, having a major portion in area consumed by a charge pump, requiring an increased layout area for the charge pump. In the present embodiment a charge pump has a pump portion partially (or latter four stages' pump portions) shared as those for active time and standby and between active and standby states the number of stages of pump portions that pump is switched. The charge pump's layout area can thus be reduced.

Figure 14:
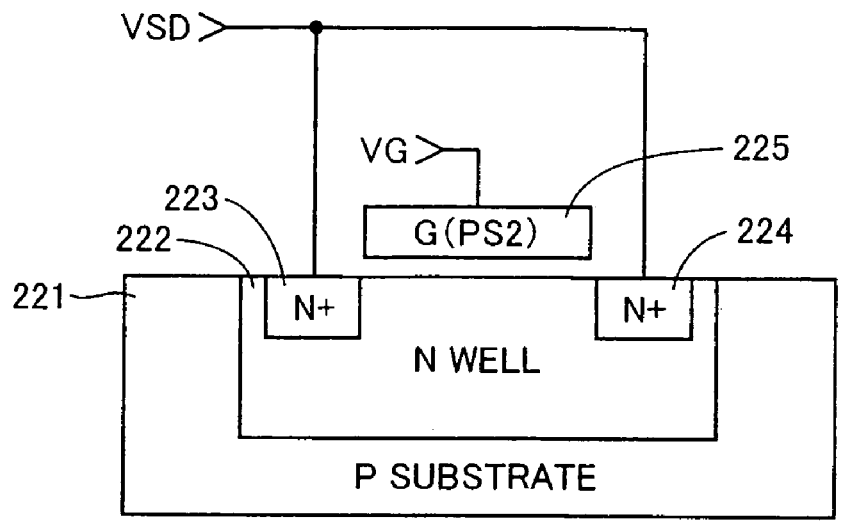
FIG. 14 is a schematic cross section of a configuration of a capacitor 175 shown in FIG. 12.

FIG. 14 is a schematic cross section of a configuration of capacitor 175 shown in FIG. 12. In the figure, capacitor 175 includes a P substrate 221, an N well 222, N+ regions 223, 224 and a gate (G) 225.

P substrate 221 has a surface with N well 222 formed thereon. On N well 222, N+ regions 223, 224 are formed. Over N well 22, gate 225 is formed of a second polysilicon PS2. N+ regions 223, 224 receive a potential VSD and gate 225 receives a potential VG.

Capacitor 175 thus configured has a thick oxide film formed between N well 222 and gate 225 and is suitable when high potentials VSD, VG are applied. Capacitor 175 has a small capacitance per unit area. Capacitor 176 has the same configuration as capacitor 175. As capacitors 175, 176 corresponding to the fifth and sixth stages' pump portions receive high voltage, capacitors 175, 176 are adapted to have a thick oxide film to withstand high voltage.

Figure 15:
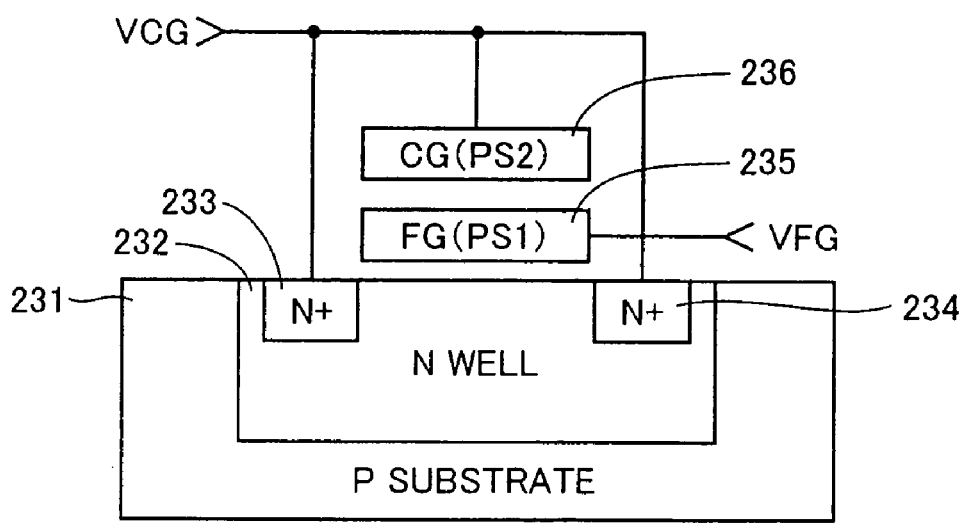
FIG. 15 is a schematic cross section of a configuration of a capacitor 211 shown in FIG. 12.

FIG. 15 is a schematic cross section of a configuration of capacitor 211 shown in FIG. 12. In the figure, capacitor 211 includes a P substrate 231, an N well 232, N+ regions 233, 234, a floating gate-(FG) 235, and a control gate (CG) 236.

P substrate-231 has a surface with N-well 232 formed thereon. On N well 232, N+ regions 233 and 234 are formed. Over N well 232, floating gate 235 is formed of a first polysilicon PS1. Floating gate 235 underlies control gate 236 formed of the second polysilicon. N+ regions 233, 234 and control gate 236 receive a potential VCG and floating gate 235 receives a potential VFG.

Capacitor 211 thus configured has a thin oxide film formed between N well 232 and floating gate 235 and is suitable when low potential VCG is applied. Capacitor 211 has a large capacitance per unit area. Capacitors 212-214 have the same configuration as capacitor 211. Thus capacitors 211-214 corresponding to the first to fourth stages' pump portions do not have high potential applied thereto, and a capacitor having a thick oxide film to withstand high voltage is not required and capacitors 211-214 having a thin oxide film are used. A smaller layout area of the pump circuit can be achieved than when a highly voltage withstanding capacitor alone is used as conventional.

With reference again to FIG. 1 positive, driving pump circuit 14 is similar in configuration to the positive pump circuits for internal operation 12, 13 and driven by clock signal CLK provided from clock generation circuit 1 and reference potential VREF provides from reference potential generation circuit 2 to generate a positive potential VPC (for example of 2.4V).

The negative pump circuits for internal operation 15-17, as well as the FIG. 2 positive pump circuits for internal operation 12, 13, include a detection circuit, a clock driver and a charge pump. The negative pump circuit for internal operation 15 detection circuit and clock driver are similar in configuration and operation to the FIG. 2 positive pump circuits for internal operation 12 and 13 detection circuits and clock drivers. The negative pump circuit for internal operation 15 charge pump is, however, different in configuration and operation from the FIG. 2 positive pump circuits for internal operation 12, 13 charge pumps.

Figure 16:
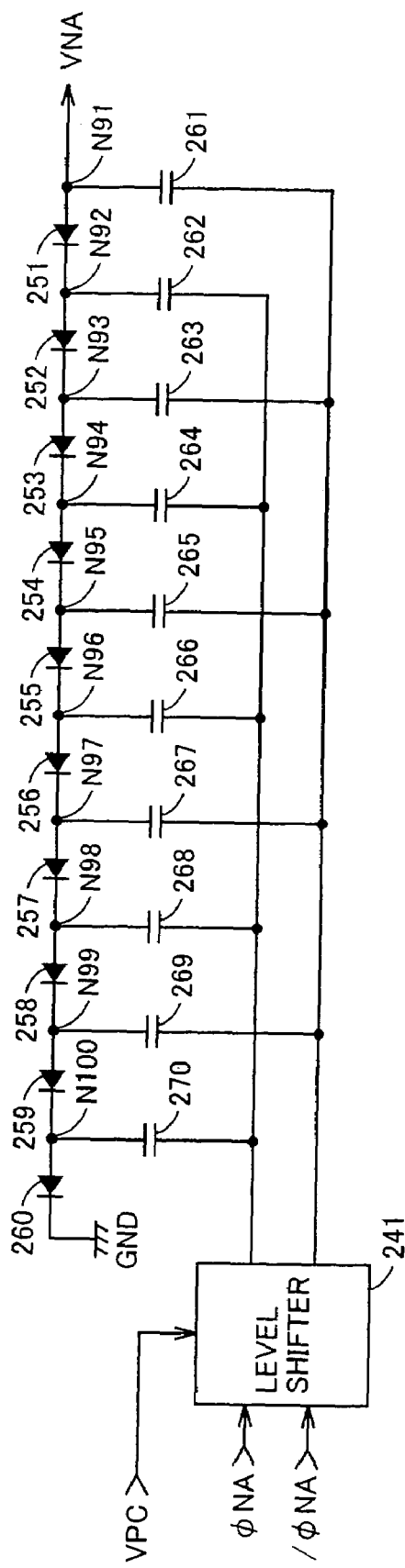
FIG. 16 is a circuit diagram showing a configuration of a charge pump of a negative pump circuit for internal operation 15 shown in FIG. 1.

With reference to FIG. 16 the negative pump circuit for internal operation 15 charge pump includes a level shifter 241, diodes 251-260, and capacitors 261-270.

The negative pump circuit for internal operation 15 clock driver generates complementary clock signals φNA and /φNA as based on clock signal CLK provided from clock generation circuit 1. Level shifter 241 is driven by potential VPC (for example of 2.4V) provided from positive, driving pump circuit 14. Level shifter 241 converts the clock signal φNA, /φNA voltage level from the external power supply potential EXVDD (for example of 1.8V) level to the potential VPC (for example of 2.4V) level for output.

Diodes 251-260 are connected in series between an output node N91 and a line of ground potential GND. The odd numbered capacitors 261-269 have their respective one electrodes connected to the odd numbered nodes N91-N99 and their respective other electrodes receiving clock signal /φNA from level shifter 241. The even numbered capacitors 262-270 have their respective ones electrodes connected to the even numbered nodes N92-N100 and their respective other electrodes receiving clock signal φNA from level shifter 241. Output node N91 outputs a potential VNA (for example of −9.2V). The diode's threshold voltage will be represented by Vdio.

When clock signal φNA is set high (VPC) diode 260 conducts and the node N100 potential is brought to the ground potential (0V) plus the diode 260 threshold voltage Vdio, i.e., a potential Vdio. Subsequently, clock signal φNA is set low (0V) and in response the node N100 potential drops to Vdio−VPC. As clock signal /φNA has been set high (VPC), diode 259 conducts and the node N99 potential attains the node N100 potential plus the diode 259 threshold voltage Vdio, i.e., a potential 2Vdio−VPC. Subsequently, clock signal /φNA is pulled low (0V) and in response the node N99 potential drops to 2(Vdio−VPC).

Thus nodes N100-N91 drops in potential by Vdio−VPC and the output node N91 potential VNA attains 10(Vdio−VPC). For example if diode threshold voltage Vdio is 1.5V and positive, driving pump circuit 14 provides potential VPC of 2.4V then potential VNA=10(1.5−2.4)=−9V.

Conventional semiconductor integrated circuit devices are not provided with positive, driving pump circuit 14, and the negative pump circuit for internal operation 15 is driven by external power supply potential EXVDD (for example of 1.8V). In that case, clock signal φNA, /φNA has a level in voltage of external power supply potential EXVDD (for example of 1.4V), and potential VNA generated will be 10(Vdio−EXVDD). For example, if diode threshold voltage Vdio is 1.5V and external power supply potential EXVDD is 1.8V then potential VNA=10(1.5−1.8)=−3V. Accordingly to generate potential VNA of −9V the number of diodes needs to be tripled, i.e., 30 diodes are required, which invites an increased layout area of the pump circuit.

In the present embodiment, by contrast, positive, driving pump circuit 14 is provided and the negative pump circuit for internal operation 15 is driven with potential VPC (for example of 2.4V). A reduced number of stages of pump is required and a reduced area of the negative pump circuit for internal operation 15 is achieved.

Note that while the positive pump circuit for normal operation 11 and the positive pump circuits for internal operation 12, 13 employ N channel MOS transistor for a charge pump, the negative pump circuit for internal operation 15 employs a polysilicon diode. For an N channel MOS transistor, a triple N well configuration can separate a backgate. As such, backgate potential can be set as desired. For a P channel MOS transistor, however, some fabrication process would force a backgate to be fixed at a P substrate's potential (or ground potential GND). As such, if a deep negative potential VNA (for example of −9.2V) is generated, the P channel MOS transistor's source and drain and the P substrate would have a difference in potential exceeding a junction withstand voltage. (This is referred to as backgate effect.) Accordingly the P channel MOS transistor is not used and a polysilicon diode is instead used as a rectifier.

Figure 17:
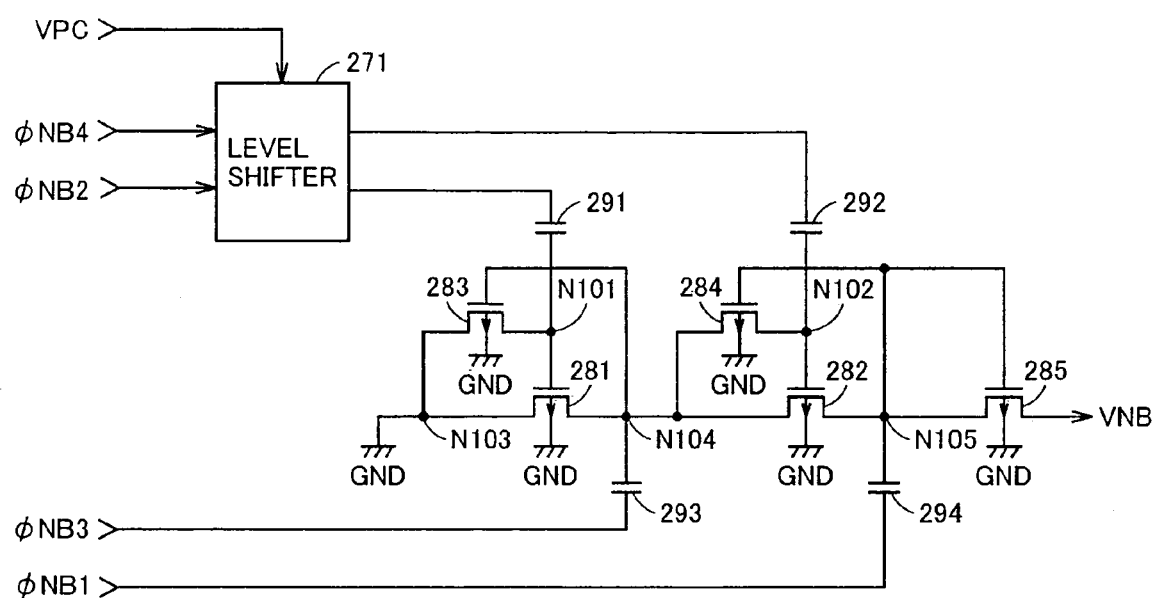
FIG. 17 is a circuit diagram showing a configuration of a charge pump of a negative pump circuit for internal operation 16 shown in FIG. 1.

With reference to FIG. 17, the negative pump circuit for internal operation 16 charge pump includes a level shifter 271, P channel MOS transistors 281-285 and capacitors 291-294.

The negative pump circuit for internal operation 16 clock driver generates 4-phase clock signals φNB1-/φNB4 as based on clock signal CLK provided from clock generation circuit 1. Level shifter 271 is driven by potential VPC (for example of 2.4V) provided from positive, driving pump circuit 14. Level shifter 241 converts the clock signal φNB2, /φNB4 voltage level from the external power supply potential EXVDD (for example of 1.8V) level to the potential VPC (for example of 2.4V) level for output.

P channel MOS transistors 281, 282 are connected in series between a line of ground potential GND and a node N105. P channel MOS transistors 281, 282 have their respective gates connected to nodes N101, N102, respectively. P channel MOS transistors 283, 284 are connected between nodes N103, N104 and nodes N101, N102, respectively. P channel MOS transistors 283, 284 have their respective gates connected to nodes N104, N105, respectively. P channel MOS transistor 285 has its drain and gate connected to node N105 to configure a diode. P channel MOS transistors 281-285 have their backgates each connected to a line of ground potential GND. P channel MOS transistor 285 has a source outputting potential VNB (−0.5V).

Capacitor 291 has one electrode receiving clock signal φNB2 from level shifter 271 and the other electrode connected to node N101. Capacitor 292 has one electrode receiving clock signal φNB4 from level shifter 271 and the other electrode connected to node N102. Capacitor 293 has one electrode receiving clock signal φNB3 from a clock driver and the other electrode connected to node N104.

Capacitor 294 has one electrode receiving clock signal φNB1 from clock driver and the other electrode connected to node N105.

The negative pump circuit for internal operation 16 is similar in operation to charge pump 65 of the positive pump circuit for internal operation 13 shown in FIG. 17. It should be noted, however, that an N channel MOS transistor is replaced with a P channel MOS transistor and node N103 is connected to a-line of ground potential GND, and accordingly nodes N104, N105 are lower in potential than 0V. Consequently, the pumping operation generates negative potential VNB (for example of −0.5V). A smaller number of stages of pump is required than when positive, driving pump circuit 14 is not provided as conventional, and a smaller area of the negative pump circuit for internal operation 16 is achieved.

With reference again to FIG. 1 the negative pump circuit 17 charge pump is similar in configuration and operation to the negative pump circuit 16 charge pump. Note that a programming operation is defined to be shorter in period than an erasure operation, and the negative pump circuit for internal operation 17 generating negative potential VNC (for example of −0.9V) required in the programming operation for a well is required to have a large driving ability. A polysilicon diode has a small current driving ability per unit area. As such, for a pump circuit generating a shallow negative potential VNC (for example of −0.9V) allowing a junction withstand voltage to be negligible, a P channel MOS transistor is better used as the rectifier as the pump circuit's layout area can be reduced. Note that the P channel MOS transistor's P substrate has a potential of a level of ground potential GND and due to the backgate effect the P channel MOS transistor's threshold voltage is slightly increased. In the present embodiment, however, positive, driving pump circuit 14 is provided and the negative pump circuit for internal operation 17 is driven by potential VPC (for example of 2.4V) provided from positive, driving pump circuit 14 so that the P channel MOS transistor's threshold voltage slightly increased does not negatively affect on operation.

Furthermore, although positive, driving pump circuit 14 contributes to an increased area therefor, a reduced area associated with the negative pump circuits for internal operation 15-17 is larger in degree than the increased area for positive, driving pump circuit 14. As a result, the semiconductor integrated circuit device is generally reduced in area. Note that the negative pump circuits for internal operation 15-17 do not operate simultaneously, and a single, positive, driving pump circuit 14 can be shared.

Figure 18:
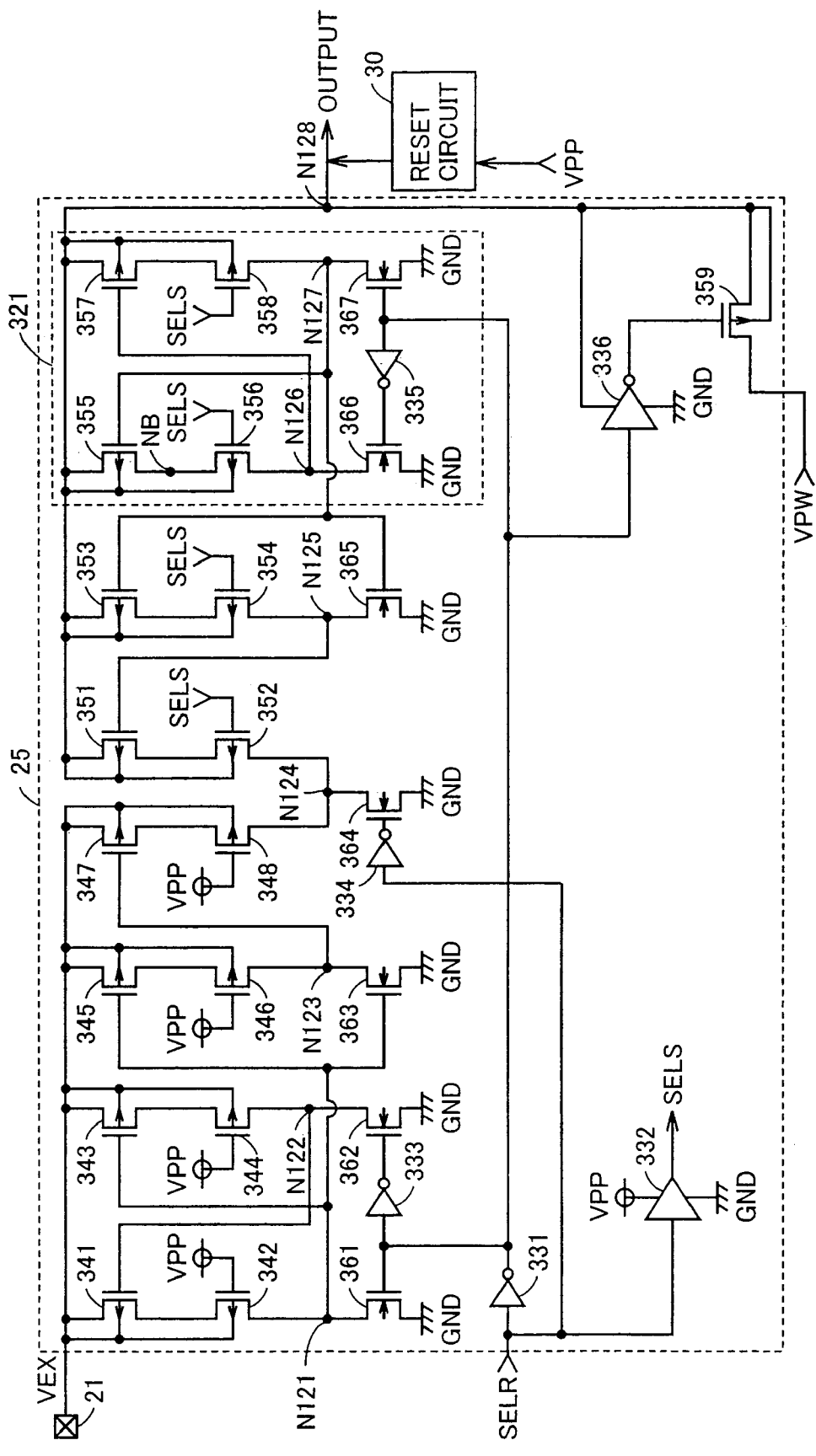
FIG. 18 is a circuit diagram showing a configuration of an external application select circuit 25 shown in FIG. 1.

With reference to FIG. 18, external application select circuit 25 includes inverters 331 and 333-336, a buffer circuit 332, P channel MOS transistors 341-348 and 458-359, and N channel MOS transistors 361-367.

P channel MOS transistors 341, 342 and N channel MOS transistor 361 are connected in series between input terminal 21 and a line of ground potential GND. P channel MOS transistor 341 has its gate connected to a node N122 and P channel MOS transistor 341 has its gate receiving potential VPP (for example of 5.5V). N channel MOS transistor 361 has its gate receiving a select signal SELR via inverter 331. P channel MOS transistors 343, 344 and N channel MOS transistor 362 are connected in series between input terminal 21 and a line of ground potential GND. P channel MOS transistor 343 has its gate connected to a node N121 and P channel MOS transistor 344 has its gate receiving potential VPP (for example of 5.5V). N channel MOS transistor 362 has its gate receiving select signal SELR via inverters 333,

331. P channel MOS transistors 345, 346 and N channel MOS transistor 363 are connected in series between input terminal 21 and a line of ground potential GND. P and N channel MOS transistors 345 and 363, respectively, have their gates connected to node N121. P channel MOS transistor 346 has its gate receiving potential VPP (for example of 5.5V). P channel MOS transistors 347, 348 and N channel MOS transistor 364 are connected in series between input terminal 21 and a line of ground potential GND. P channel MOS transistor 347 has its gate connected to a node N123 and P channel MOS transistor 348 has its gate receiving potential VPP (for example of 5.5V). N channel MOS transistor 364 has its gate receiving select signal SELR via inverter 334.

Buffer circuit 332 is driven by potential VPP (for example of 5.5V) and outputs select signal SELR having a level in voltage converted from the external power supply potential EXVDD (for example 1.8V) level to the potential VPP (for example of 5.5V) level, i.e., a signal SELS. Inverter 336 is driven by a potential of an output node N128 and has an input terminal receiving select signal SELR via inverter 331 and an output terminal connected to P channel MOS transistor 359 at the gate. P channel MOS transistor 359 is connected between an output node of the positive pump circuit for internal operation 13 and output node N128.

P channel MOS transistors 351, 352 are connected in series between output node N128 and an node N124. P channel MOS transistor 351 has its gate connected to a node N125 and P-channel MOS transistor 352 has its gate receiving signal SELS output from buffer circuit 332. P channel MOS transistors 353, 354 and N channel MOS transistor 365 are connected in series between output node N128 and a line of ground potential GND. P and N channel MOS transistors 353 and 365, respectively, have their gates connected to a node N127. P channel MOS transistor 354 has its gate receiving signal SELS output from buffer circuit 332. P channel MOS transistors 355, 356 and N channel MOS transistor 366 are connected in series between output node N128 and a line of ground potential GND. P channel MOS transistor 355 has its gate connected to node N127 and P channel MOS transistor 356 has its gate receiving signal SELS output from buffer circuit 332. N channel MOS transistor 366 has its gate receiving select signal SELR via inverters 335, 331. P channel MOS transistors 357, 358 and N channel MOS transistor 367 are connected in series between output node N128 and a line of ground potential GND. P channel MOS transistor 357 has its gate connected to a node N126 and P channel MOS transistor 358 has its gate receiving signal SELS output from buffer circuit 332. N channel MOS transistor 367 has its gate receiving select signal SELR via inverter 331.

Figure 19:
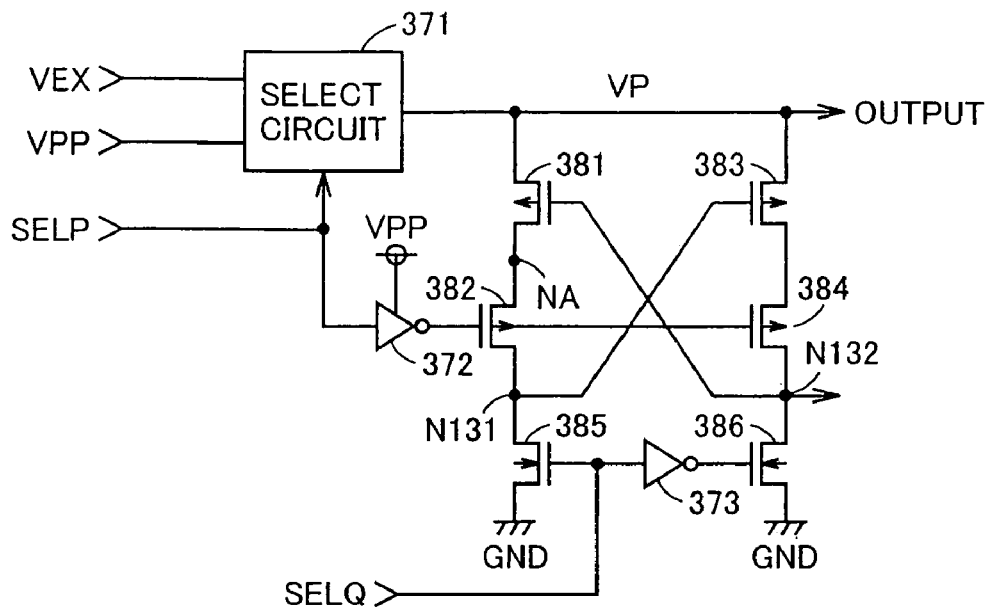
FIG. 19 is a simplified circuit block diagram corresponding to the FIG. 18 circuit.

FIG. 19 is a simplified circuit block diagram corresponding to the FIG. 18 external application select circuit 25. An application of the FIG. 19 circuit configuration is the FIG. 18 external application select circuit 25. In FIG. 19, select signals SELP, SELQ are signals having a potential amplitude in a range from 0V to external power supply potential EXVDD (for example of 1.8V). A select circuit 371 for select signal SELP having the high level selects potential VPP (for example of 5.5v) received from the positive pump circuit for normal operation 11 via reset circuit 30 and for select signal SELP having the low level selects an external potential VEX (for example of 10V) provided from input terminal 21 and outputs the selected potential as VP. An inverter 372 is driven by potential VPP (for example of 5.5V) provided from the positive pump circuit for normal operation 11. Inverter 372 inverts the logic level of select signal. SELP and also converts the voltage level from the external power supply potential EXVDD (for example of 1.8V) level to the potential VPP (for example of 5.5V) level for output.

P channel MOS transistors 381, 382 are connected in series between an output node of select circuit 371 and a node N131. P channel MOS transistor 381 has its gate connected to an output node N132. P channel MOS transistor 382 has its gate connected to an output node of inverter 372. P channel MOS transistors 383, 384 are connected in series between the output node of select circuit 371 and node N132. P channel MOS transistor 383 has its gate connected to node N131. P channel MOS transistor 384 has its gate connected to the output node of inverter 372. P channel MOS transistors 382, 384 are provided to reduce a difference in potential between the P channel MOS transistors 381, 383 source and drain to prevent P channel MOS transistors 381, 383 from degradation.

N channel MOS transistor 385 is connected between node N131 and a line of ground potential GND. N channel MOS transistor 385 has its gate receiving select signal SELQ. N channel MOS transistor 386 is connected between output node N132 and a line of ground potential GND. N channel MOS transistor 386 has its gate receiving select signal SELQ via inverter 373.

Figure 20:
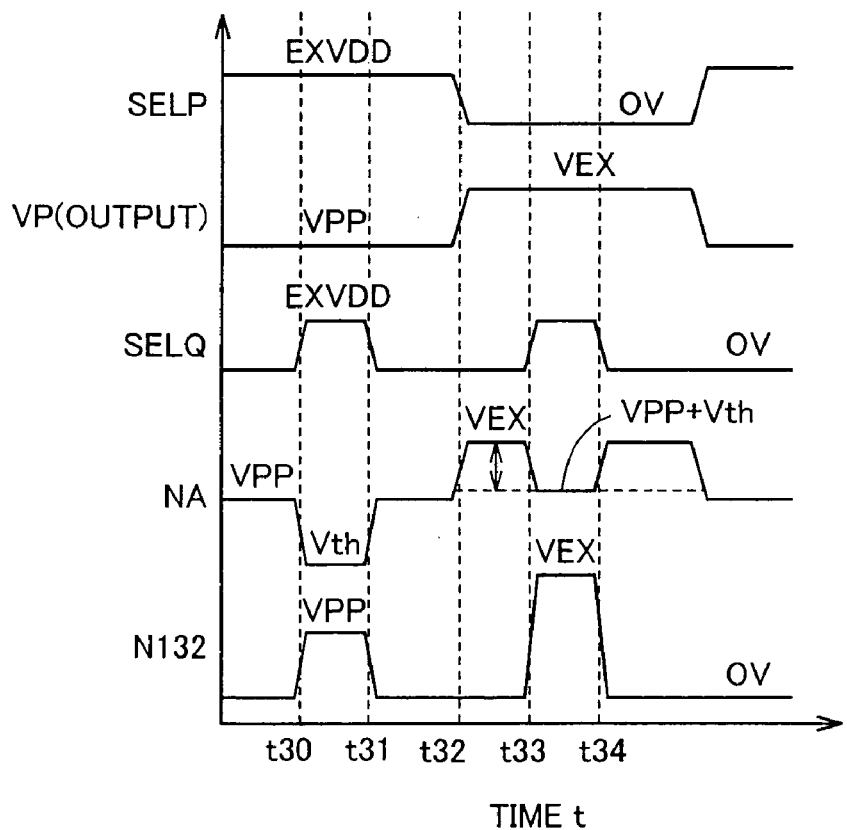
FIG. 20 is timing plots for illustrating an operation of the FIG. 19 circuit.

FIG. 20 is timing plots for illustrating an operation of the FIG. 19 circuit. At time t30, select circuit 371 operates in response to select signal SELP of the high level to select and output potential VPP. Furthermore, in response to select signal SELQ having been pulled high, N channel MOS transistor 385 turns on and N channel MOS transistor 386 turns off. In response, node N131 is pulled low and P channel MOS transistor 383 turns on. Inverter 372 receives select signal SELP of the high level and outputs a signal of the low level (0V). P channel MOS transistors 382, 384 turn on in response to a signal of the low level provided from inverter 372. Node NA is brought to the P channel MOS transistor 382 gate voltage level (0V) plus the P channel MOS transistor 382 threshold voltage Vth, i.e., a potential Vth, and output node N132 is set high (VPP). P channel MOS transistor 381 turns off.

At time t31, select signal SELQ is pulled low. In response, N channel MOS transistor 385 turns off and N channel MOS transistor 386 turns on. This pulls output node N132 low (0V) and turns on P channel MOS transistor 381. In response, nodes NA, N131 are pulled high (VPP). P channel MOS transistor 383 turns off.

At time t32, select signal SELP is pulled low. In response, select circuit 371 selects and outputs potential VEX. This increases node NA in potential to VEX.

At time t33, select signal SELQ is pulled high. In response, N channel MOS transistor 385 turns on and N channel MOS transistor 386 turns off. This pulls node N131 low and turns on P channel MOS transistor 383. P channel MOS transistor 384 has its gate receiving potential VPP (for example of 5.5V) and its drain receiving potential VEX (for example of 10V), and the transistor thus turns on. In response, output node N132 is pulled high (VEX). This turns off P channel MOS transistor 381 and brings the node NA potential to a potential of the high level (VPP) provided from inverter 372 plus the P channel MOS transistor 382 threshold voltage Vth, i.e., a voltage VPP+Vth.

At time t34, select signal SELQ is pulled low. In response, N channel MOS transistor 385 turns off and N channel MOS transistor 386 turns on. This pulls output node N132 low (0V) and turns on P channel MOS transistor 381. In response, node NA is pulled high (VEX). P channel MOS transistor 382 has its gate receiving potential VPP (for example of 5.5V) and its drain receiving potential VEX (for example of 10V), and the transistor thus turns on. This sets node N131 high and turns off P channel MOS transistor 383.

Conventional external application select circuits are not provided with inverter 372 and the P channel MOS transistors 382, 384 gates receive external power supply potential EXVDD (for example 1.8V). In that case at a time immediately before time t34, at which P channel MOS transistor 381 turns on, there is a large difference in potential between the P channel MOS transistor 381 source (or the output node of select circuit 371) and drain (or node NA). More specifically at time t33 select signal SELQ is pulled high and in response N channel MOS transistor 385 turns on and N channel MOS transistor 386 turns off. This pulls node N131 low and turns on P channel MOS transistor 383. P channel MOS transistor 384 has its gate receiving potential EXVDD (for example 1.8V) and has its drain receiving potential VEX (for example of 10V), and the transistor thus turns on. In response, output node N132 is pulled high (VEX). This turns off P channel MOS transistor 381 and brings the node NA potential to the P channel MOS transistor 382 gate voltage level (EXVDD) plus the P channel MOS transistor 382 threshold voltage Vth, i.e., a potential EXVDD+Vth. At time t34 select signal SELQ is pulled low and in response N channel MOS transistor 386 turns on and N channel MOS transistor 385 turns off. This pulls output node N132 low and turns on P channel MOS transistor 381.

As such at the time immediately before time t34, at which P channel MOS transistor 381 turns on, the P channel MOS transistor 381 source (or the output node of select circuit 371) and drain (or node NA) will have therebetween a difference in potential of VEX−(EXVDD+Vth). For example if external power supply potential EXVDD is 1.8V and external potential VEX is 10V the P channel MOS transistor 381 source (or the output node of select circuit 371) and drain (or node NA) have therebetween a difference in potential of 8.2−Vth. Thus at a time immediately before P channel MOS transistor 381 turns on the transistor's source (or the output node of select circuit 371) and drain (or node NA) have therebetween a difference in potential exceeding a voltage withstanding level, resulting in a degraded P channel MOS transistor in some cases.

In the present embodiment, by contrast, P channel MOS transistors 382, 384 have their gates receiving a signal output from inverter 372 driven by potential VPP (for example 5.5V). This allows a difference in potential of VEX−(EXVDD+Vth) between the P channel MOS transistor 381 source (or the output node of select circuit 371) and drain (or node NA) at a time immediately before time t34, at which P channel MOS transistor 381 turns on, as shown in FIG. 20. For example if potential VPP is 5.5V and external potential VEX is 10V the P channel MOS transistor 381 source (the output node of select circuit 371) and drain (or node NA) have therebetween a difference in potential of 4.5V−Vth. As such at a time immediately before P channel MOS transistor 381 turns on the P channel MOS transistor 381 source (or the output node of select circuit 371) and drain (or node NA) have therebetween a reduced difference in potential. Thus at a time immediately before a P channel MOS transistor turns on the P channel MOS transistor's source and drain have a difference in potential limited to be lower than a voltage withstanding level to prevent P channel MOS transistor from degradation.

Figure 21:
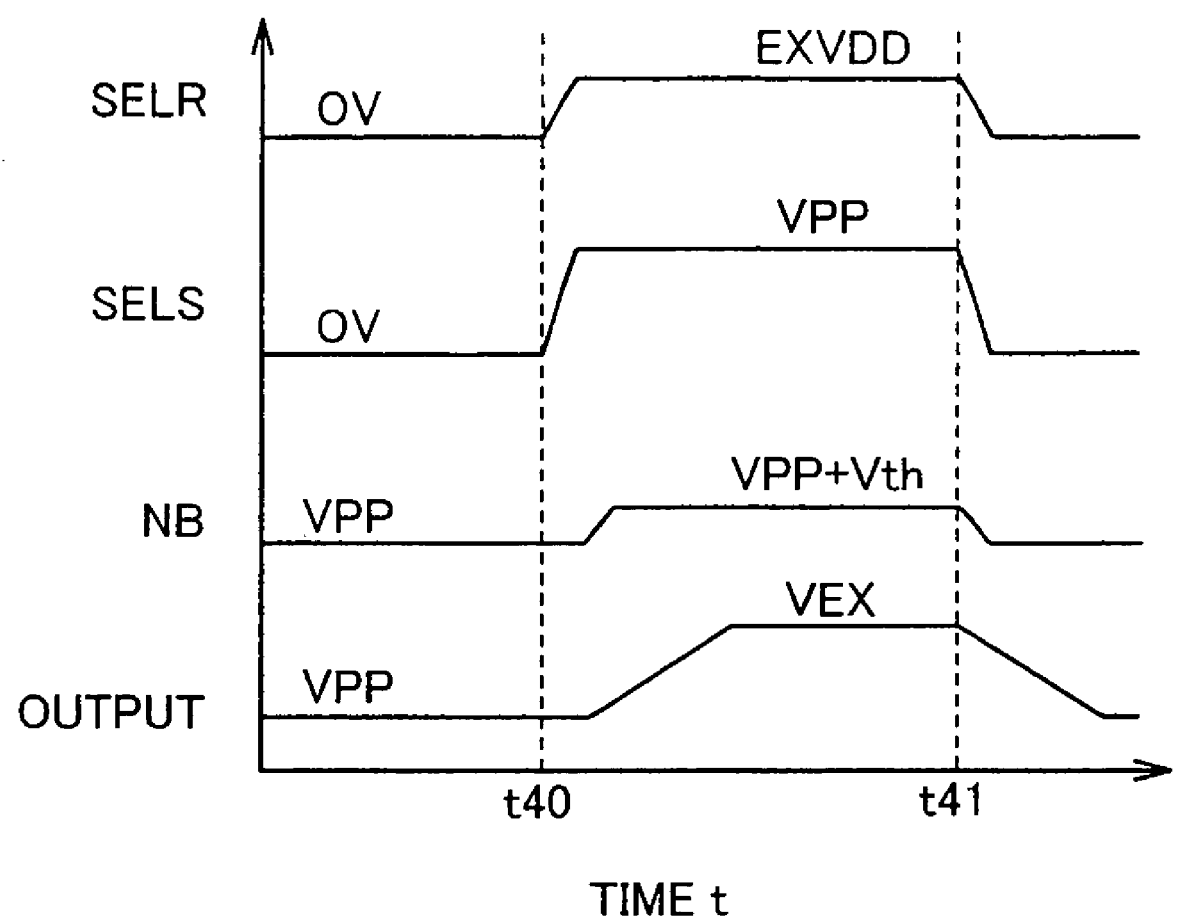
FIG. 21 is timing plots for illustrating an operation of the FIG. 18 circuit.

With reference again to FIG. 18 external application select circuit 25 operates as will be described hereinafter. With reference to FIG. 21, external application select circuit 25 at a main portion 321, in particular, operates as will be described hereinafter. Note that the external application select circuit 25 output potential is not switched directly from potential VPW (from the positive pump circuit for internal operation 13) to external potential VEX (from input terminal 21) but once brought to potential VPP (from the positive pump circuit for normal operation 11), since when the positive pump circuit for internal operation 13 is inactivated, reset circuit 30 provides the external application select circuit 23 output potential (VPP) to an output node of external application select circuit 25. Hereinafter the external application select circuit 25 output potential is switched between potential VPP and external potential VEX in an operation, in particular, as will be described hereinafter.

In a period prior to time t40, in response to select signal SELR of the low level (0V) N channel MOS transistor 366 turns off and N channel MOS transistor 367 turns on. This sets node N127 low and turns on P channel MOS transistor 355. Buffer circuit 332 operates in response to select signal SELR of the low level to output signal SELS of the low level. P channel MOS transistor 356 turns on in response to signal SELS of the low level. This sets node N126 high and turns off P channel MOS transistor 357. Potential VPP (for example of 5.5V) from reset circuit 30 is transmitted via P channel MOS transistor 355 to node NB and the node NB potential is brought to VPP. Note that at that time, external VEX provided from input terminal 21 is not transmitted to output node N128, and output node N128 is receiving potential VPP from reset circuit 30.

At time t40 select signal SELR is pulled high (EXVDD). In response, N channel MOS transistor 366 turns on and N channel MOS transistor 367 turns off. This sets node N126 low and turns on P channel MOS transistor 357. Buffer circuit 332 operates in response to select signal SELR of the high level (EXVDD) to output signal SELS of the high level (VPP). P channel MOS transistor 358 has its gate receiving potential VPP (for example of 5.5V) and its drain receiving potential VEX (for example 10V), and the transistor thus turns on. This pulls node N127 high and turns off P channel MOS transistor 355. The node NB potential is brought to potential VPP (for example of 5.5V) received by P channel MOS transistor 356 at the gate plus the P channel MOS transistor 356 threshold voltage Vth, i.e., a potential VPB+Vth. Output node N128 receives external potential VEX from input terminal 21.

At time t41, select signal SELR is pulled low (0V). In response, N channel MOS transistor 367 turns on and N channel MOS transistor 366 turns off. This pulls node N127 low and turns on P channel MOS transistor 355. Buffer circuit 332 operates in response to select signal SELR of the low level (0V) to output select signal SELS of the low level (0V). P channel MOS transistor 356 has its gate receiving select signal SELS of the low level (0V) and its drain receiving potential VPP+Vth, and the transistor thus turns on. This pulls node N126 high and turns off P channel MOS transistor 357. The node NB potential is brought to VPP. Note that external potential VEX provided from input terminal 21 is not transmitted to output node N 128, and output node N128 is receiving potential. VPP from reset circuit 30.

Conventionally, P channel MOS transistors 342, 344, 346, 348, 352, 354, 356, 358 have their gates connected to line of external power supply potential EXVDD (for example 1.8V). In that case from time t40 through time t41 the node NB potential is brought to potential EXVDD (for example of 1.8V) received by P channel MOS transistor 356 at the gate plus the P channel MOS transistor 356 threshold voltage Vth, i.e., a potential EXVDD+Vth.

At time t41, select signal SELR is pulled low (0V). In response, N channel MOS transistor 367 turns on and N channel MOS transistor 366 turns off. This pulls node N127 low and turns on P channel MOS transistor 355.

As such at the time immediately before time t41, at which P channel MOS transistor 355 turns on, the P channel MOS transistor 355 source (or output node N128) and drain (or node NB) will have therebetween a difference in potential of VEX−(EXVDD+Vth). For example if external power supply potential EXVDD is 1.8V and potential VEX is 10V the P channel MOS transistor 355 source (or output node N128) and drain (or node NB) have therebetween a difference in potential of 8.2−Vth. Thus at a time immediately before P channel MOS transistor 355 turns on the transistor's source (or output node N128) and drain (or node NB) have therebetween a difference in potential exceeding a voltage withstanding level, resulting in a degraded P channel MOS transistor in some cases. This is influenced by reduction in voltage of external power supply voltage EXVDD.

Accordingly in the present embodiment P channel MOS transistors 342, 344, 346, 348 have their gates receiving potential VPP (for example of 5.5V) from the positive pump circuit for normal operation 11 and P channel MOS transistors 352, 354, 356, 358 have their gates receiving a signal output from buffer circuit 322 driven by potential VPP (for example of 5.5V). Thus, potential VPP (for example of 5.5V) higher than external power supply potential EXVDD (for example 1.8V) and constantly generated from the positive pump circuit for normal operation 11 is utilized. It should be noted, however, that when the output node N128 potential is brought to VPP, P channel MOS transistors 352, 354, 356, 358 need to have their gates brought in potential to be lower than VPP. Accordingly, select signal SELR is employed to switch a level in voltage of a signal output from buffer circuit 332.

Thus, as shown in FIG. 21, at a time immediately before time t41, at which P channel MOS transistor 355 turns on, the P channel MOS transistor 355 source (or output node N128) and drain (or node NB) have therebetween a difference in potential of VEX−(VPP+Vth). For example if potential VPP is 5.5V and external potential VEX is 10V the P channel MOS transistor 355 source and drain have therebetween a difference in potential of 4.5V−Vth. As such at a time immediately before P channel MOS transistor 355 turns on the P channel MOS transistor 355 source (or output node N128) and drain (or node NB) have therebetween a reduced difference in potential. Thus at a time immediately before a P channel MOS transistor turns on the P channel MOS transistor's source and drain have a difference in potential limited to be lower than a voltage withstanding level to prevent P channel MOS transistor from degradation.

Note that with reference again to FIG. 1, external application select circuits 23, 24, 26-28 are similar in configuration and operation to external application select circuit 25. As such, a similar effect can also be obtained for external application select circuits 23, 24, 26-28.

Figure 22:
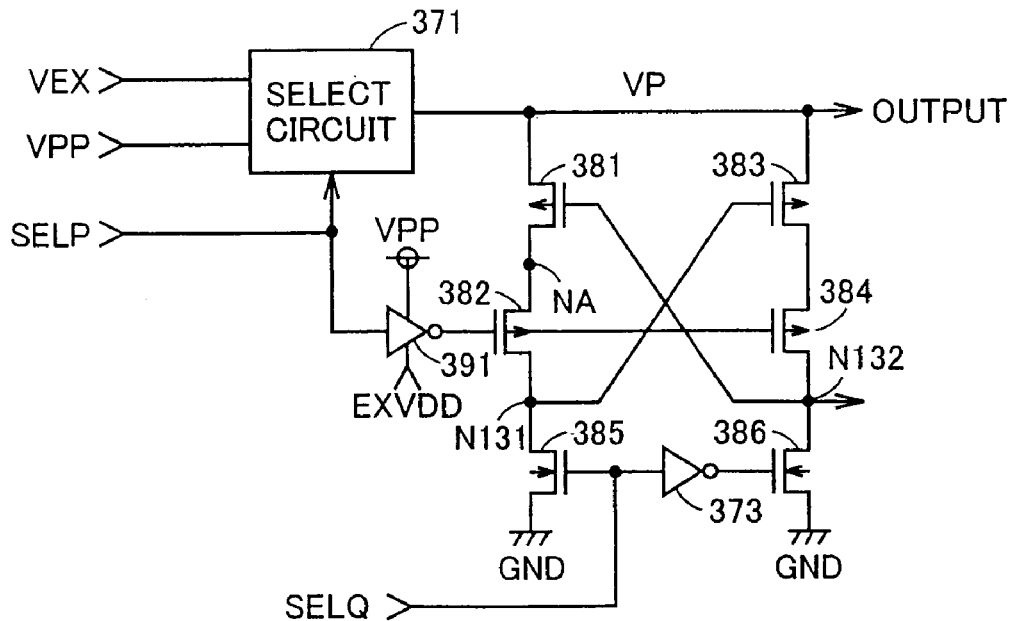
FIGS. 22-25 show first to fourth exemplary variations of an embodiment of the present invention.

Hereinafter first to fourth exemplary variations of the embodiment will be described. The first exemplary variation is shown in FIG. 22, in which the FIG. 19 inverter 372 is replaced with an inverter 391. In FIG. 22, inverter 391 has a power supply terminal receiving potential VPP (for example of 5.5V) and a ground terminal receiving potential EXVDD (for example of 1.8V). Inverter 391 for select signal SELP having the high level (EXVDD) outputs a signal of the low level (EXVDD) and for select signal SELP having the low level (0V) outputs a signal of the high level (VPP).

The FIG. 22 circuit is similar in operation to the FIG. 19 circuit except that, with reference to the FIG. 20 timing plots, the node NA potential is brought to a potential EXVDD+Vth in a period from time t30 through time t31.

Thus in the first exemplary variation at a time immediately before P channel MOS transistor 381 turns on the P channel MOS transistor 381 source (or the output node of select circuit 371) and drain (or node NA) have therebetween a reduced difference in potential. Thus at a time immediately before a P channel MOS transistor turns on the P channel MOS transistor's source and drain have a difference in potential limited to be lower than a voltage withstanding level to prevent P channel MOS transistor from degradation.

Note that by applying the FIG. 22 circuit configuration to the FIG. 1 external application select circuits 23-28, external application select circuits 23-28 can be prevented from having an impaired P channel MOS transistor.

Figure 23:
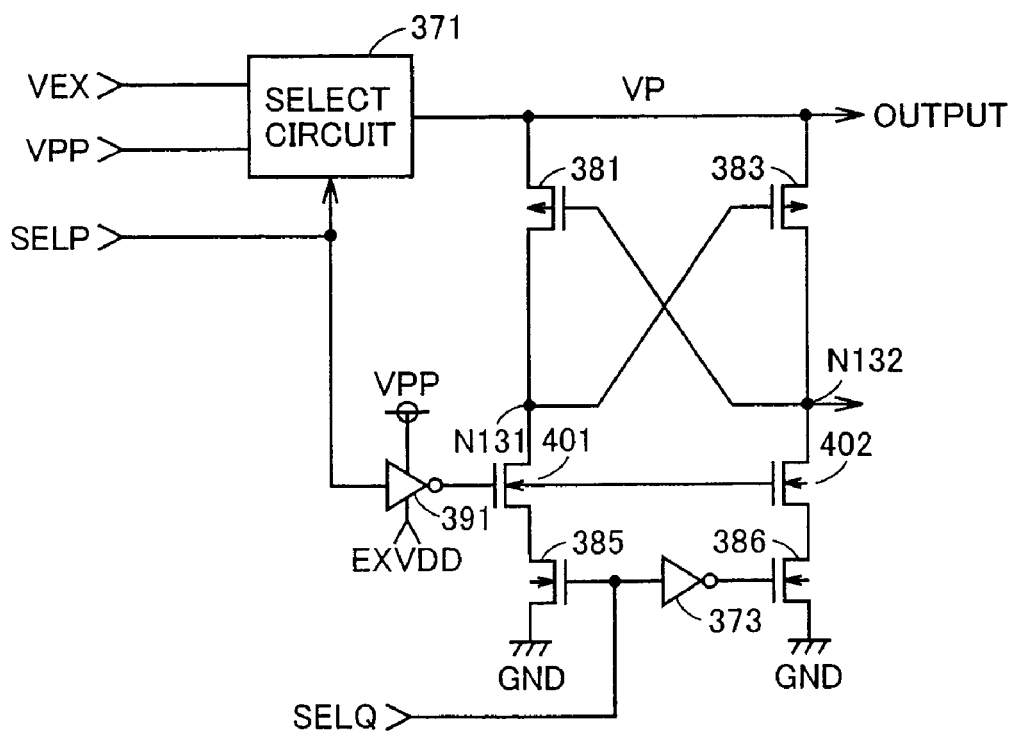

The second exemplary variation is shown in FIG. 23, in which the FIG. 22 P channel MOS transistors 382, 384 are removed and N channel MOS transistors 401, 42 are additionally introduced. With reference to FIG. 22, N channel MOS transistor 401 is connected between node NA and the N channel MOS transistor 385 drain. N channel MOS transistor 402 is connected between output node 132 and the N channel MOS transistor 386 drain. N channel MOS transistors 401, 402 have their gates receiving a signal output from inverter 391.

Thus in the second exemplary variation at a time immediately before N channel MOS transistors 385, 386 turn on the transistors' source and drain have therebetween a reduced difference in potential. Thus at a time immediately before an N channel MOS transistor turns on the transistor's source and drain has a difference in potential limited to be lower than a voltage withstanding level to prevent N channel MOS transistor from degradation.

Note that by applying the FIG. 23 circuit configuration to the FIG. 1 external application select circuits 23-28, external application select circuits 23-28 can be prevented from having an impaired N channel MOS transistor.

Figure 24:
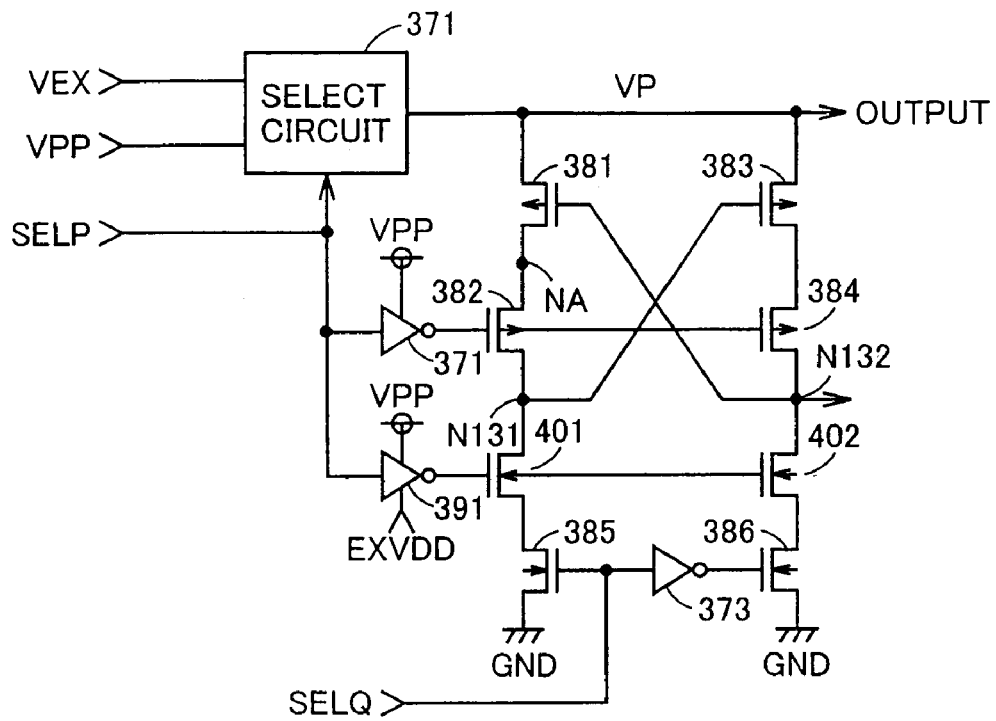

The third exemplary variation is shown in FIG. 24, in which the FIG. 23 inverter 391 and N channel MOS transistors 401, 402 are additionally introduced in the FIG. 19 circuit. Thus in the third exemplary variation at a time immediately before P channel MOS transistors 381, 383 turn on the transistors' source and drain have therebetween a reduced difference in potential. Thus at a time immediately before a P channel MOS transistor turns on the transistor's source and drain have a difference in potential limited to be lower than a voltage withstanding level to prevent P channel MOS transistor from degradation.

Furthermore at a time immediately before N channel MOS transistors 385, 386 turn on the transistors' source and drain have therebetween a reduced difference in potential. Thus at a time immediately before an N channel MOS transistor turns on the transistor's source and drain have a difference in potential limited to be lower than a voltage withstanding level to prevent N channel MOS transistor from degradation.

Note that by applying the FIG. 23 circuit configuration to the FIG. 1 external application select circuits 23-28, external application select circuits 23-28 can be prevented from having impaired P and N channel MOS transistors.

Figure 25:
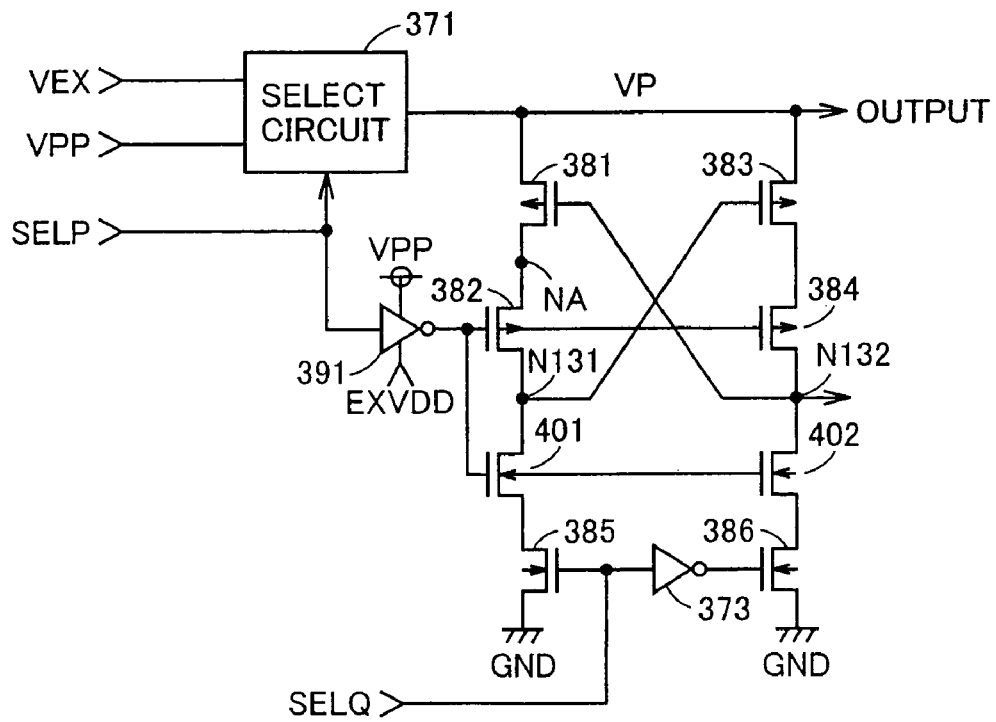

The fourth exemplary variation is shown in FIG. 25, in which the FIG. 24 inverter 371 is removed. With reference to FIG. 25, P channel MOS transistors 382, 384 and N channel MOS transistors 401, 402 have their gates all receiving signal output from inverter 391.

Thus in the fourth exemplary variation at a time immediately before P channel MOS transistors 381, 383 turn on the transistors' source and drain have therebetween a reduced difference in potential. Thus at a time immediately before a P channel MOS transistor turns on the transistor's source and drain have a difference in potential limited to be lower than a voltage withstanding level to prevent P channel MOS transistor from degradation.

Furthermore at a time immediately before N channel MOS transistors 385, 386 turn on the transistors' source and drain have therebetween a reduced difference in potential. Thus at a time immediately before an N channel MOS transistor turns on the transistor's source and drain have a difference in potential limited to be lower than a voltage withstanding level to prevent N channel MOS transistor from degradation.

Note that by applying the FIG. 23 circuit configuration to the FIG. 1 external application select circuits 23-28, external application select circuits 23-28 can be prevented from having impaired P and N channel MOS transistors.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a first charge pump circuit pumping in an active time when said semiconductor device has an internal circuit in operation;

a second charge pump circuit having an output node connected to said first charge pump circuit's output node and pumping in a standby time when said semiconductor device has the internal circuit on standby; and a third charge pump circuit having an input node connected to said first and second charge pump circuits' output node and pumping in said active and standby times.

2. The semiconductor device of claim 1, wherein:

said first charge pump circuit includes a first number of series connected unit charge pump circuits;

said second charge pump circuit includes a second number of series connected unit charge pump circuits, said second number being smaller than said first number; and said third charge pump circuit includes a plurality of series connected unit charge pump circuits.

* * * * *